US012706145B2

(12) United States Patent
Liu et al.

(10) Patent No.: US 12,706,145 B2
(45) Date of Patent: Aug. 11, 2026

(54) THREE-DIMENSIONAL MEMORY DEVICES AND FABRICATING METHODS THEREOF

(71) Applicant: Yangtze Memory Technologies Co., Ltd., Wuhan (CN)

(72) Inventors: Xiaoxin Liu, Wuhan (CN); ZongLiang Huo, Wuhan (CN); Lei Xue, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 725 days.

(21) Appl. No.: 18/145,600

(22) Filed: Dec. 22, 2022

(65) Prior Publication Data

US 2024/0185918 A1 Jun. 6, 2024

(30) Foreign Application Priority Data

Dec. 1, 2022 (CN) ........................ 202211532791.3

(51) Int. Cl.

| | |
|---|---|
| ***G11C 16/04*** | (2006.01) |
| ***H10B 41/27*** | (2023.01) |
| ***H10B 41/35*** | (2023.01) |
| ***H10B 41/41*** | (2023.01) |
| ***H10B 43/27*** | (2023.01) |
| ***H10B 43/35*** | (2023.01) |
| ***H10B 43/40*** | (2023.01) |
| ***H10W 20/41*** | (2026.01) |
| ***H10W 20/42*** | (2026.01) |

(52) U.S. Cl.

CPC ......... *G11C 16/0483* (2013.01); *H10B 41/27* (2023.02); *H10B 41/35* (2023.02); *H10B 41/41* (2023.02); *H10B 43/27* (2023.02); *H10B 43/35* (2023.02); *H10B 43/40* (2023.02); *H10W 20/42* (2026.01); *H10W 20/435* (2026.01)

(58) Field of Classification Search

CPC ........ H10B 41/41; H10B 43/27; H10B 43/35; H10B 43/40; H10B 41/40; H10B 41/27; H10B 41/35; G11C 16/0483; H01L 23/5226; H01L 23/5283; H01L 2224/08145; H10W 20/42; H10W 20/435

See application file for complete search history.

(56) References Cited

U.S. PATENT DOCUMENTS

2001/0017798 A1 * 8/2001 Ishii .................. G11C 16/3459 257/E27.099
2002/0135549 A1 * 9/2002 Kawata ................ G09G 3/3648 257/E27.111

(Continued)

FOREIGN PATENT DOCUMENTS

CN 110520992 * 11/2019 ............. H10B 43/40

*Primary Examiner* — Galina G Yushina
(74) *Attorney, Agent, or Firm* — Conley Rose, P.C.

(57) ABSTRACT

The present disclosure provides a memory device having a first semiconductor structure and a second semiconductor structure. The first semiconductor structure includes a first set of peripheral circuits having a first transistor configured to operate with a first voltage, and a second set of peripheral circuits having a second transistor configured to operate with a second voltage lower than the first voltage. The second set of peripheral circuits are disposed over the first set of peripheral circuits. The second semiconductor structure includes memory cells coupled to the first semiconductor structure.

20 Claims, 18 Drawing Sheets

(56) References Cited

U.S. PATENT DOCUMENTS

| | | | | |
|---|---|---|---|---|
| 2004/0076070 | A1* | 4/2004 | Kim | G11C 7/12<br>365/232 |
| 2020/0328180 | A1* | 10/2020 | Cheng | H01L 25/18 |
| 2020/0328186 | A1* | 10/2020 | Liu | H01L 25/18 |
| 2021/0159258 | A1* | 5/2021 | Wakashima | H10F 30/21 |
| 2022/0130846 | A1* | 4/2022 | Kim | H01L 23/5226 |
| 2023/0005863 | A1* | 1/2023 | Yang | H01L 24/03 |
| 2023/0005865 | A1* | 1/2023 | Liu | H01L 24/80 |

* cited by examiner

300

700
568
530
562
550
552
550
552
562
510

800
568
531
562
550
552
562
510

THREE-DIMENSIONAL MEMORY DEVICES AND FABRICATING METHODS THEREOF

CROSS-REFERENCE TO RELATED APPLICATIONS AND INCORPORATION BY REFERENCE

This application claims priority to Chinese Patent Application No. 202211532791.3, filed on Dec. 1, 2022, which is incorporated herein by reference in its entirety.

BACKGROUND

Implementations of the present disclosure relate to three-dimensional (3D) memory devices and fabrication methods thereof.

Planar memory cells are scaled to smaller sizes by improving process technology, circuit designs, programming algorithms, and fabrication processes. However, as feature sizes of the memory cells approach a lower limit, planar processes and fabrication techniques become challenging and costly. As a result, memory density for planar memory cells approaches an upper limit.

A 3D memory architecture can address the upper density limitation in planar memory cells. The 3D memory architecture includes a memory array and peripheral devices for controlling signals to and from the memory array.

BRIEF SUMMARY

Implementations of 3D memory devices and fabrication methods thereof are disclosed herein.

One aspect of the present disclosure provides a method for forming a three-dimensional (3D) memory device. The method includes forming a first semiconductor structure and a second semiconductor structure and then bonding the second semiconductor structure and the first semiconductor structure to form the 3D memory device. The forming of the first semiconductor structure includes forming a first transistor on a first substrate, disposing a first semiconductor layer over the first transistor, and forming a second transistor on the first semiconductor layer. The first transistor includes a first gate dielectric layer and the second transistor includes a second gate dielectric layer having a thickness less than a thickness of the first gate dielectric layer. The second semiconductor structure includes memory cells.

In one implementation, the disposing of the first semiconductor layer includes wafer bonding, smart-cut and/or chemical vapor deposition.

In one implementation, the forming of the second transistor includes forming a fully-depleted transistor, wherein the fully-depleted transistor comprises an active device region fully depleted during operation.

In one implementation, the forming of the fully-depleted transistor includes forming a source/drain region vertically extending through the first semiconductor layer.

In one implementation, the disposing of the first semiconductor layer includes disposing the first semiconductor layer with a thickness less than 100 nm.

In one implementation, the method further includes forming the first semiconductor layer with a thickness in a range between 50 nm and 100 nm.

In one implementation, the forming of the first semiconductor structure further includes forming an isolation structure vertically penetrating through the first semiconductor layer to electrically isolate the second transistor.

In one implementation, the forming of the first semiconductor structure further includes, before disposing the first semiconductor layer, disposing a first insulating layer on the first transistor; and forming first interconnect structures in the first insulating layer to electrically connect to the first transistor.

In one implementation, the forming of the first semiconductor structure further includes disposing a second insulating layer on the second transistor; and forming second interconnect structures in the second insulating layer to electrically connect to the second transistor, wherein at least one of the second interconnect structures extends through the isolation structure and is electrically connected with at least one of the first interconnect structures.

In one implementation, the forming of the second semiconductor structure includes forming a film stack of alternating conductive and dielectric layers on a second semiconductor layer; forming memory strings vertically penetrating through the film stack; and forming a staircase structure in the film stack.

In one implementation, the forming of the second semiconductor structure further includes disposing a third insulating layer on the film stack; and forming third interconnect structures electrically connected with a word line or a bit line, wherein at least one of the third interconnect structures is electrically connected with at least one of the second interconnect structures after the bonding of the second semiconductor structure and the first semiconductor structure.

In one implementation, the method also includes forming a through-substrate-interconnect vertically penetrating through the second semiconductor layer; and forming a contact pad electrically connected to the through-substrate-interconnect, wherein the contact pad and the film stack are on opposite sides of the second semiconductor layer.

In one implementation, the forming of the second semiconductor structure further comprises forming a contact VIA (vertical-interconnect-access) extending through the third insulating layer, wherein the contact VIA is electrically connected to the through-substrate-interconnect and at least one of the second interconnect structures.

Another aspect of the present disclosure provides a memory device having a first semiconductor structure and a second semiconductor structure disposed on the first semiconductor structure. The first semiconductor structure includes a first transistor having a first gate dielectric layer, a first semiconductor layer disposed on the first transistor, and a second transistor disposed on the first semiconductor layer. The second transistor includes a second gate dielectric layer having a thickness less than a thickness of the first gate dielectric layer. The second semiconductor structure includes memory cells coupled to the first transistor and the second transistor.

In one implementation, the first transistor is configured to operate with a first voltage and the second transistor is configured to operate with a second voltage, wherein the second voltage is lower than the first voltage.

In one implementation, the first voltage is higher than 3.3 V.

In one implementation, the second voltage is not higher than 3.3V.

In one implementation, the first transistor comprises a first threshold voltage and the second transistor comprises a second threshold voltage with a magnitude lower than a magnitude of the first threshold voltage.

In one implementation, the first semiconductor layer comprises a thickness less than 100 nm.

In one implementation, the first semiconductor layer comprises a thickness in a range between 50 nm and 100 nm.

In one implementation, the second transistor is a fully-depleted transistor having at least a portion of an active device region fully depleted during operation.

In one implementation, the second transistor comprises a source/drain region vertically extending through the first semiconductor layer.

In one implementation, the first semiconductor structure further includes an isolation structure vertically penetrating through the first semiconductor layer to electrically isolate the second transistor.

In one implementation, the first semiconductor structure further includes a first insulating layer disposed on the first transistor; and first interconnect structures disposed in the first insulating layer, wherein at least one of the first interconnect structures is electrically connected with the first transistor.

In one implementation, the first semiconductor structure further includes a second insulating layer disposed on the second transistor; and second interconnect structures disposed in the second insulating layer, wherein at least one of the second interconnect structures is electrically connected with the second transistor.

In one implementation, at least one of the second interconnect structures is connected with at least one of the first interconnect structures by extending through the isolation structure.

In one implementation, the second semiconductor structure further includes a film stack of alternating conductive and dielectric layers; and memory strings vertically penetrating through the film stack.

In one implementation, the second semiconductor structure further includes a third insulating layer covering the film stack; and third interconnect structures in the third insulating layer, wherein the third interconnect structures are electrically connected with a word line, a bit line or at least one of the second interconnect structures.

In one implementation, the memory device further includes a second semiconductor layer; a through-substrate-interconnect penetrating through the second semiconductor layer; and a contact pad electrically connected with the through-substrate-interconnect, wherein the contact pad and the film stack are on opposite sides of the second semiconductor layer.

In one implementation, the memory device further includes a contact vertical-interconnect-access (VIA) penetrating through the third insulating layer, wherein the contact VIA is connected with the through-substrate-interconnect and at least one of the second interconnect structures.

Yet another aspect of the present disclosure provides a memory device having a first semiconductor structure and a second semiconductor structure. The first semiconductor structure includes a first set of peripheral circuits having a first transistor configured to operate with a first voltage, and a second set of peripheral circuits having a second transistor configured to operate with a second voltage lower than the first voltage. The second set of peripheral circuits are disposed over the first set of peripheral circuits. The second semiconductor structure includes memory cells coupled to the first semiconductor structure.

In one implementation, the first voltage is higher than 3.3 V.

In one implementation, the second voltage is not higher than 3.3V.

In one implementation, the first transistor includes a first gate dielectric layer and the second transistor includes a second gate dielectric layer having a thickness less than a thickness of the first gate dielectric layer.

In one implementation, the first transistor includes a first threshold voltage, and the second transistor includes a second threshold voltage, wherein a magnitude of the second threshold voltage is less than a magnitude of the first threshold voltage.

In one implementation, the second set of peripheral circuits are disposed on a first semiconductor layer, and the first semiconductor layer is disposed over the first set of peripheral circuits.

In one implementation, the first semiconductor layer includes a thickness less than 100 nm.

In one implementation, the first semiconductor layer includes a thickness in a range between 50 nm and 100 nm.

In one implementation, the second set of peripheral circuits further includes an isolation structure vertically penetrating through the first semiconductor layer.

In one implementation, the first set of peripheral circuits includes a first interconnect structure and the second set of peripheral circuits includes a second interconnect structure, wherein the first interconnect structure and the second interconnect structure are electrically connected with each other by extending through the isolation structure.

In one implementation, the second transistor includes a source/drain region vertically extending through the first semiconductor layer.

In one implementation, the second set of peripheral circuits includes a fully-depleted transistor having an active device region fully depleted during operation.

In one implementation, the first set of peripheral circuits comprises a word-line driver and/or a bit-line driver.

In one implementation, the second set of peripheral circuits includes a page buffer, a sense amplifier and/or an input/output (I/O) circuit.

Yet another aspect of the present disclosure provides a storage system including a memory controller and a memory device. The memory device includes a first semiconductor structure having a first set of peripheral circuits configured to operate with a first voltage, and a second set of peripheral circuits configured to operate with a second voltage lower than the first voltage. The second set of peripheral circuits are disposed over the first set of peripheral circuits. The memory device also includes a second semiconductor structure disposed on the first semiconductor structure, wherein the second semiconductor structure includes memory cells coupled to the first semiconductor structure.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

Figure 1A:
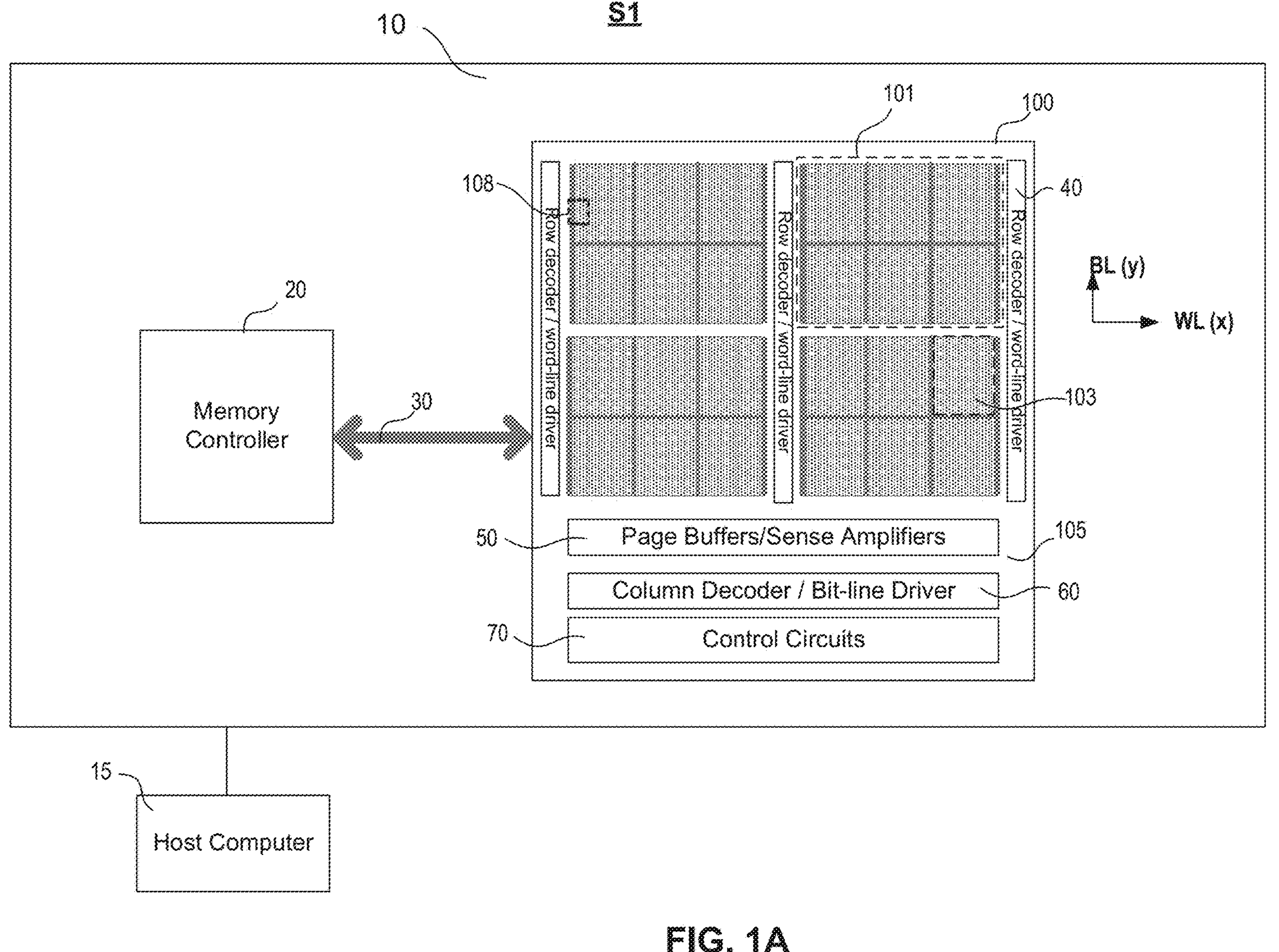
FIGS. 1A-1C illustrate a memory system with a NAND flash memory, according to some implementations of the present disclosure.

Implementations of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one implementation," "an implementation," "an example implementation," "some implementations," etc., indicate that the implementation described may include a particular feature, structure, or characteristic, but every implementation may not necessarily include the particular feature, structure, or characteristic. Moreover, such phrases do not necessarily refer to the same implementation. Further, when a particular feature, structure or characteristic is described in connection with an implementation, it would be within the knowledge of a person skilled in the pertinent art to effect such feature, structure or characteristic in connection with other implementations whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

The term "or," as used herein, is inclusive; more specifically, the phrase "A or B" means "A, B, or both A and B." Exclusive "or" is designated herein by terms such as "either A or B" and "one of A or B," for example.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vertical interconnect access (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., +10%, +20%, or +30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

FIG. 1A illustrates a block diagram of an exemplary system S1 having a memory system 10, according to some implementations of the present disclosure. System S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The memory system 10 (also referred to as a NAND memory system) includes a NAND flash memory 100 and a host controller 20 (also referred to as a memory controller). The memory system 10 can communicate with a host computer 15 through the memory controller 20, where the memory controller 20 can be connected to the NAND flash memory 100 via a memory channel 30. In some implementations, the memory system 10 can have more than one NAND flash memory 100, while each NAND flash memory 100 can be managed by the memory controller 20.

In some implementations, the host computer 15 can include a processor of an electronic device, such as a central processing unit (CPU), or a system-on-chip (SoC), such as an application processor (AP). The host computer 15 sends data to be stored at the NAND memory system or memory system 10 or retrieves data by reading the memory system 10.

The memory controller 20 can handle I/O requests received from the host computer 15, ensure data integrity and efficient storage, and manage the NAND flash memory 100. The memory channel 30 can provide data and control communication between the memory controller 20 and the NAND flash memory 100 via a data bus.

Figure 1B:
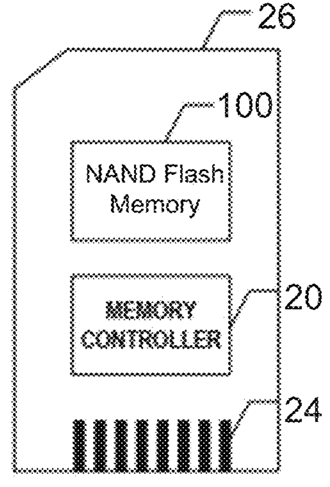
Figure 1C:
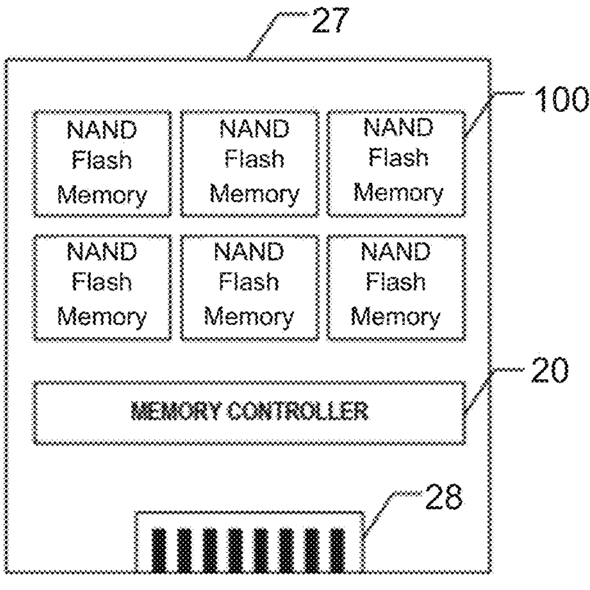

Memory controller 20 and one or more NAND flash memory 100 can be integrated into various types of storage devices, for example, be included in the same package, such as a universal Flash storage (UFS) package or an eMMC package. That is, memory system 10 can be implemented and packaged into different types of end electronic products. In one example as shown in FIG. 1B, memory controller 20 and a single NAND flash memory 100 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 16). In another example as shown in FIG. 1C, memory controller 20 and multiple NAND flash memories 100 can be integrated into a solid state drive (SSD) 27. SSD 27 can further include an SSD connector 28 coupling SSD 27 with a host (e.g., the host computer 15 in FIG. 1A).

Referring to FIG. 1A, the NAND flash memory 100 (i.e., "flash," "NAND flash" or "NAND") can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1A, the exemplary NAND flash memory 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" respectively in FIG. 1A. In this disclosure, one or more memory block 103 can also be referred to as the "memory array" or "array." The memory array is the core area in a memory device, performing storage functions.

The NAND flash memory 100 also includes a peripheral circuit region 105, an area surrounding memory planes 101. The peripheral circuit region 105, also named as peripheral circuits, contains many digital, analog, and/or mixed-signal circuits to support functions of the memory array, for example, page buffers/sense amplifiers 50, row decoders/word-line drivers 40, column decoder/bit-line drivers 60, and control circuits 70. Control circuits 70 include register, active and/or passive semiconductor devices, such as transistors, diodes, capacitors, resistors, etc., as would be apparent to a person of ordinary skill in the art. The control circuits 70 of the peripheral circuit region 105 can be configured to initiate a program operation on a select memory cell of a NAND memory string in the memory block 103. In some implementations, the control circuits 70 receives a program command from a memory controller (e.g., memory controller 20) through interface, and in response, sends control signals to at least row decoder/word-line driver, column decoder/bit-line driver, and voltage generator deposed in the peripheral circuit region 105 to initiate the program operation on the select memory cell.

It is noted that the layout of the electronic components in the memory system 10 and the NAND flash memory 100 in FIG. 1A are shown as an example. The memory system 10 and the NAND flash memory 100 can have other layout and can include additional components. For example, The NAND flash memory 100 can also have high-voltage charge pumps, I/O circuits, etc. The memory system 10 can also include firmware, data scrambler, etc. In some implementations, the peripheral circuit region 105 and the memory array can be formed independently on separate wafers and then connected with each other through wafer bonding.

Figure 2:
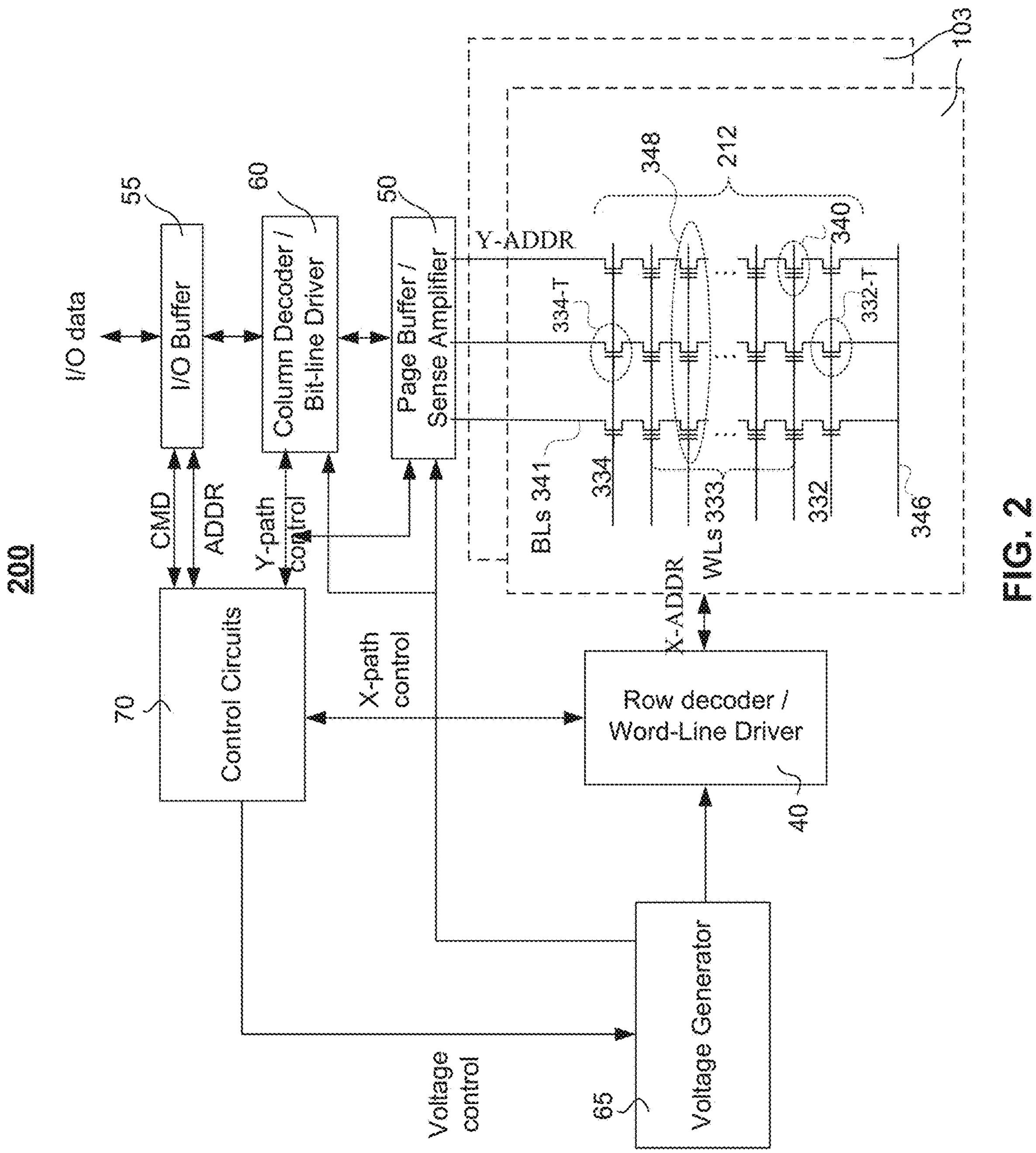
FIG. 2 shows a schematic circuit diagram of a NAND flash memory, according to some implementations of the present disclosure.

FIG. 2 shows a schematic diagram 200 of the NAND flash memory 100, according to some implementations of the present disclosure. The NAND flash memory 100 includes one or more memory blocks 103. Each memory block 103 includes memory strings 212. Each memory string 212 includes memory cells 340. The memory cells 340 sharing the same word line forms a memory page 348. The memory string 212 can also include at least one field effect transistor (e.g., MOSFET) at each end, which is controlled by a bottom select gate (BSG) 332 and a top select gate (TSG) 334, respectively. The drain terminal of a top select transistor 334-T can be connected to the bit line 341, and the source terminal of a bottom select transistor 332-T can be connected to an array common source (ACS) 346. The ACS 346 can be shared by the memory strings 212 in an entire memory block, and is also referred to as the common source line.

The NAND flash memory 100 can also include a peripheral circuit that includes many digital, analog, and/or mixed-signal circuits to support functions of the memory block 103, for example, a page buffer/sense amplifier 50, a row decoder/word-line driver 40, a column decoder/bit-line driver 60, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

The memory blocks 103 can be coupled with the row decoder/word-line driver 40 via word lines ("WLs") 333, bottom select gates ("BSGs") 332 and top select gates ("TSG") 334. The memory blocks 103 can be coupled with the page buffer/sense amplifier 50 via bit lines ("BLs") 341. The row decoder/word-line driver 40 can select one of the memory blocks 103 on the NAND flash memory 100 in response to an X-path control signal provided by the control circuits 70. The row decoder/word-line driver 40 can transfer voltages provided by the voltage generator 65 to the word lines according to the X-path control signal. During the read and programming operation, the row decoder/word-line driver 40 can transfer a read voltage Vread and a program voltage Vpgm, respectively, to a selected word line, and transfer a pass voltage Vpass to an unselected word line, according to the X-path control signal received from the control circuits 70.

The column decoder/bit-line driver 60 can transfer an inhibit voltage Vinhibit to an unselected bit line and connect a selected bit line to ground according to a Y-path control signal received from the control circuits 70. In the other words, the column decoder/bit-line driver 60 can be configured to select or unselect one or more memory strings 212 according to the Y-path control signal from the control circuits 70. The page buffer/sense amplifier 50 can be configured to read and program (write) data from and to the memory block 103 according to the Y-path control signal from the control circuits 70. For example, the page buffer/sense amplifier 50 can store one page of data to be programmed into one memory page 348. In another example, the page buffer/sense amplifier 50 can perform verify operations to ensure that the data has been properly programmed into each memory cell 340. In yet another example, during a read operation, the page buffer/sense amplifier 50 can sense current flowing through the bit line 341 that reflects the logic state (i.e., data) of the memory cell 340 and amplify small signal to a measurable magnification.

The input/output buffer 55 can transfer I/O data from/to the page buffer/sense amplifier 50 as well as addresses ADDR or commands CMD to the control circuits 70. In some implementations, the input/output buffer 55 can function as an interface between the memory controller 20 (in FIG. 1A) and the NAND flash memory 100.

The control circuits 70 can control the page buffer/sense amplifier 50 and the row decoder/word-line driver 40 in response to the commands CMD transferred by the input/output buffer 55. During the programming operation, the control circuits 70 can control the row decoder/word-line driver 40 and the page buffer/sense amplifier 50 to program a selected memory cell. During the read operation, the control circuits 70 can control the row decoder/word-line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index, a block index and a plane index to identify the memory page 348, memory block 103, and memory plane 101 (in FIG. 1A), respectively. The column address Y-ADDR can identify a byte or a word in the data of the memory page 348.

In some implementations, the control circuits 70 can include one or more control logic unit. Each control logic unit described herein can be either a software module and/or a firmware module running on a processor, such as a microcontroller unit (MCU), which is part of control circuits 70, or a hardware module of a finite-state machine (FSM), such as an integrated circuit (IC, e.g., application-specific IC (ASIC), field-programmable gate array (FPGA), etc.), or a combination of software module, firmware module, and hardware module.

The voltage generator 65 can generate voltages to be supplied to word lines and bit lines under the control of the control circuits 70. The voltages generated by the voltage generator 65 include the read voltage Vread, the program voltage Vpgm, the pass voltage Vpass, the inhibit voltage $V_{inhibit}$, etc.

In some implementations, the NAND flash memory 100 can be formed based on the floating gate technology. In some implementations, the NAND flash memory 100 can be formed based on charge trapping technology. The NAND flash memory based on charge trapping can provide high storage density and high intrinsic reliability. Storage data or logic states (e.g., threshold voltage Vth of the memory cell 340) depend on the amount of charge trapped in a storage layer. In some implementations, the NAND flash memory 100 can be a three-dimensional (3D) memory device, where the memory cells 340 can be vertically stacked on top of each other.

Figure 3:
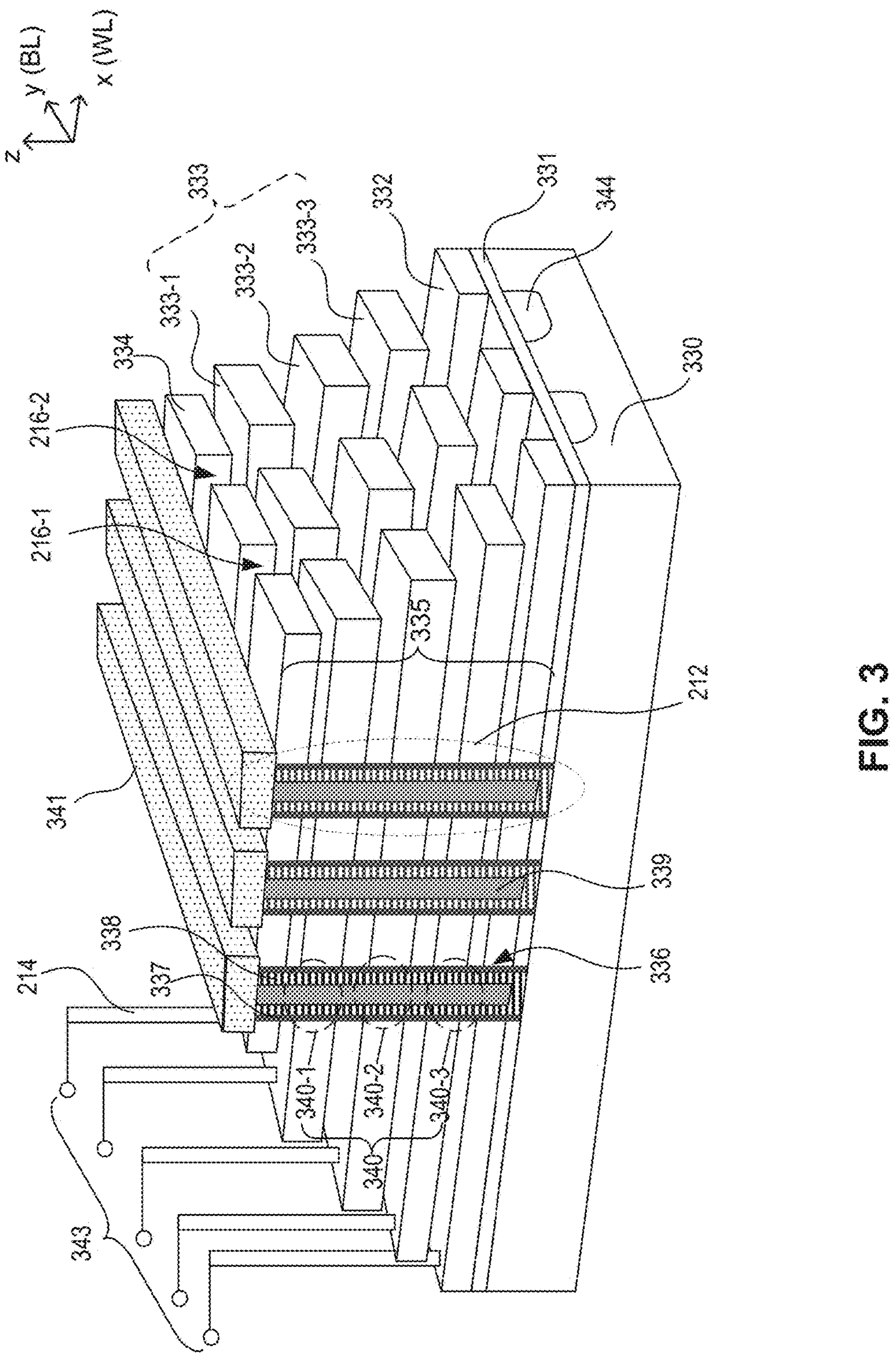
FIG. 3 illustrates a perspective view of a three-dimensional (3D) NAND flash memory, in accordance with some implementations of the present disclosure.

FIG. 3 illustrates a perspective view of a portion of a 3D NAND flash memory, according to some implementations of the present disclosure. The 3D NAND flash memory 300 can be a portion of the NAND flash memory 100. In some implementations, the 3D NAND flash memory 300 shows structures in a memory array of the NAND flash memory 100. The 3D NAND flash memory 300 can include a substrate 330, an insulating film 331 over the substrate 330, a tier of bottom select gates (BSGs) 332 over the insulating film 331, and tiers of control gates 333, also referred to as "word lines (WLs)," stacking on top of the BSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The 3D NAND flash memory 300 also includes a tier of top select gates (TSGs) 334 over the stack of control gates 333. The stack of TSG 334, control gates 333 and BSG 332 is also referred to as "gate electrodes". The 3D NAND flash memory 300 further includes memory strings 212 and doped source line regions 344 in portions of substrate 330 between adjacent BSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filler 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel layer 338 of the respective memory cell. The 3D NAND flash memory 300 further includes bit lines (BLs)

341 connected with the memory strings 212 over the TSGs 334. The 3D NAND flash memory 300 also includes metal interconnect lines 343 connected with the gate electrodes through contact structures 214. In some implementations, the edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of BSG 332. In this example, each memory string 212 can include three memory cells 340-1, 340-2 and 340-3, corresponding to the control gates 333-1, 333-2 and 333-3, respectively. In some implementations, the number of control gates and the number of memory cells can be more than three to increase storage capacity. The 3D NAND flash memory 300 can also include other structures, for example, TSG cut, common source contact, array common source and dummy memory string. These structures are not shown in FIG. 3 for simplicity.

Figure 4A:
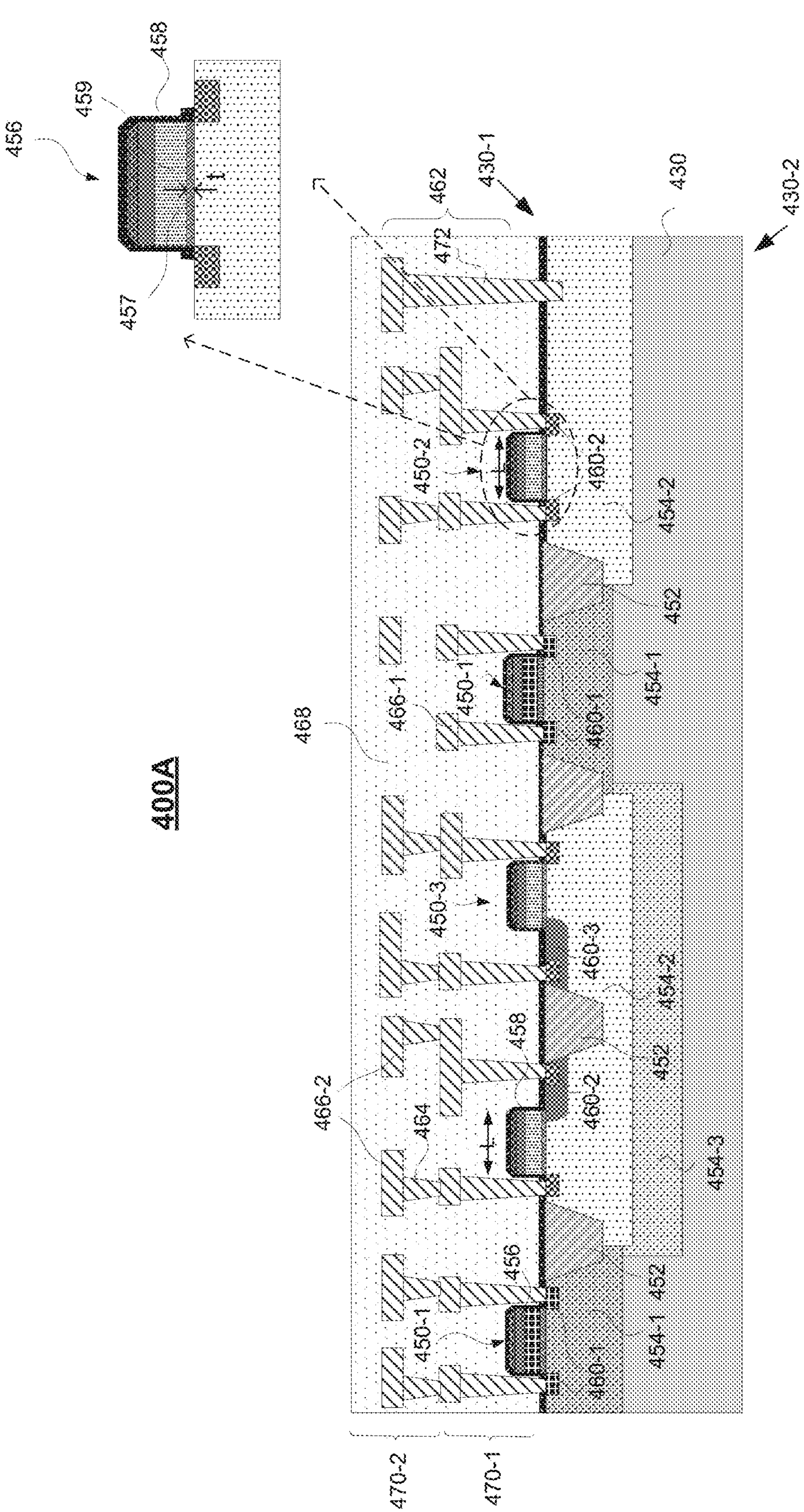
FIG. 4A illustrates a cross-sectional view of peripheral circuits, according to some implementations of the present disclosure.

FIG. 4A illustrates a cross-section of a peripheral circuit 400A of a 3D memory device according to some implementations of the present disclosure. The peripheral circuit 400A can include a peripheral substrate 430, where the peripheral substrate 430 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof. In some implementations, the peripheral substrate 430 can be double-side polished prior to peripheral device fabrication. In this example, the peripheral substrate 430 includes surfaces on the top and bottom sides (also referred to as a first side 430-1 and a second side 430-2, or a front side and a backside, respectively) both polished and treated to provide a smooth surface for high quality semiconductor devices. The first and second sides 430-1 and 430-2 are opposite sides of the peripheral substrate 430.

The peripheral circuit 400A can include one or more peripheral devices 450 (e.g. 450-1, 450-2, 450-3, etc.) on a first side 430-1 of the peripheral substrate 430. The peripheral device 450 can be formed “on” the peripheral substrate 430, in which the entirety or part of the peripheral device 450 is formed in the peripheral substrate 430 (e.g., below the top surface of the peripheral substrate 430) and/or directly on the peripheral substrate 430. The peripheral device 450 can include any suitable semiconductor devices, for example, metal oxide semiconductor field effect transistors (MOSFETs), bipolar junction transistors (BJTs), diodes, resistors, capacitors, inductors, etc. Among the semiconductor devices, p-type and/or n-type MOSFETs (i.e., CMOS) are widely implemented in logic circuit design, and are used as examples for the peripheral device 450 in the present disclosure. In this example, the peripheral circuit 400A is also referred to a CMOS wafer 400A.

The peripheral device 450 can be either a p-channel MOSFET or an n-channel MOSFET and can include, but not limited to, an active device region surrounded by shallow-trench-isolation (STI) 452, a well 454 (e.g., 454-1, 454-2, 454-3, etc.) formed in the active device region with n-type or p-type doping, a gate stack 456 that includes a gate dielectric layer 457, a gate conductor 459 and/or a gate hard mask. The peripheral device 450 can also include a source/drain extension and/or halo region (not shown in FIG. 4A), a gate spacer 458 and a source/drain 460 (e.g., 460-1, 460-2, etc.) locating on each side of the gate stack. The peripheral device 450 can further include a silicide contact area (not shown) in the top portion of the source/drain. Other devices (e.g., diodes, capacitors, resistors, etc.) can be also formed on the peripheral substrate 430.

The STI 452 can be formed through patterning the substrate using lithography and etching, filling an insulating material and polishing the insulating material to form a coplanar surface on the peripheral substrate 430. The insulating material for STI 452 can include silicon oxide, silicon oxynitride, TEOS, low-temperature oxide (LTO), high temperature oxide (HTO), silicon nitride, etc. The insulating material for STI 452 can be disposed using techniques such as chemical vapor deposition (CVD), physical vapor deposition (PVD), plasma-enhanced CVD (PECVD), low pressure chemical vapor deposition (LPCVD), high density plasma (HDP) chemical vapor deposition, rapid thermal chemical vapor deposition (RTCVD), metal organic chemical vapor deposition (MOCVD), atomic layer deposition (ALD), sputtering, thermal oxidation or nitridation, or combinations thereof. The forming of STI 452 can also include a high temperature annealing step to densify the disposed insulating material for improved electrical isolation. In some implementations, the STI 452 is shallower than the well 454 in a vertical direction perpendicular to the peripheral substrate 430.

The well 454 of the peripheral device 450 can include a p-type doped well 454-2 for n-channel MOSFET 450-2 and an n-type doped well 454-1 for p-channel MOSFET 450-1, and is called p-well 454-2 and n-well 454-1, respectively. The dopant profile and concentration of the well 454 affects the device characteristics of the peripheral device 450. For MOSFET devices with low threshold voltage (Vt), the well 454 can be doped with lower concentration, and can form low-voltage p-well or low-voltage n-well. For MOSFET with high Vt, the well 454 can be doped with higher concentration, and can form high-voltage p-well or high-voltage n-well. In some implementations, to provide electrical isolation from a p-type substrate, a deep n-well 454-3 can be formed underneath a high-voltage p-well 454-2 for an n-channel MOSFET 450-3 with high Vt (also referred to as high-voltage nMOSFET or HV NMOS 450-3).

The forming of an n-well can include any suitable n-type dopant, such as phosphorus, arsenic, antimony, etc., and/or any combination thereof. The forming of a p-well can include any suitable p-type dopant, for example boron. The dopant incorporation can be achieved through ion implantation followed by activation anneal, or through in-situ doping during epitaxy for the active device region.

The gate stack 456 of the peripheral device 450 can be formed by a “gate first” scheme, where the gate stack 456 is disposed and patterned prior to source/drain formation. The gate stack 456 of the peripheral device 450 can also be formed by a “replacement” scheme, where a sacrificial gate stack can be formed first and then replaced by a high-k dielectric layer and a gate conductor after source/drain formation.

In some implementations, the gate dielectric layer 457 can be made of silicon oxide, silicon nitride, silicon oxynitride, and/or high-k dielectric films such as hafnium oxide, zirconium oxide, aluminum oxide, tantalum oxide, magnesium oxide, or lanthanum oxide films, and/or combinations thereof. The gate dielectric layer 457 can be disposed by any suitable methods such as CVD, PVD, PECVD, LPCVD, RTCVD, sputtering, MOCVD, ALD, thermal oxidation or nitridation, or combinations thereof. The gate dielectric layer 457 includes a thickness t. In some implementations, the gate dielectric layer 457 of the MOSFET with higher Vt is thicker than that of the MOSFET with lower Vt. In some implementations, the thickness t is a physical thickness of the gate dielectric layer 457. In some implementations, the thickness t is an effective thickness taking into account the k dielectric constant of the high-k dielectric film.

In some implementations, the gate conductor 459 can be made from a metal or metal alloy, such as tungsten, cobalt, nickel, copper, or aluminum, and/or combinations thereof. In some implementations, the gate conductor can also include a conductive material, such as titanium nitride (TiN), tantalum nitride (TaN), etc. The gate conductor can be formed by any suitable deposition methods, for example, sputtering, thermal evaporation, e-beam evaporation, ALD, PVD, and/or combinations thereof.

In some implementations, the gate conductor can also include a poly-crystalline semiconductor, such as poly-crystalline silicon, poly-crystalline germanium, poly-crystalline germanium-silicon and any other suitable material, and/or combinations thereof. In some implementations, the poly-crystalline material can be incorporated with any suitable types of dopant, such as boron, phosphorous, or arsenic, etc. In some implementations, the gate conductor can also be an amorphous semiconductor with aforementioned materials.

In some implementations, the gate conductor can be made from a metal silicide, including WSix, CoSix, NiSix, or AlSix, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

The gate spacer 458 can be formed through disposing an insulating material and then performing anisotropic etching. The insulating material for the gate spacer 458 can be any insulator, including silicon oxide, silicon nitride, silicon oxynitride, TEOS, LTO, HTO, etc. The gate spacer 458 can be disposed using techniques such as CVD, PVD, PECVD, LPCVD, RTCVD, MOCVD, ALD, sputtering, or combinations thereof. The anisotropic etching of the gate spacer 458 includes dry etching, for example reactive ion etching (RIE).

A gate length L of the gate stack 456 between the source/drain 460 is an important feature of the MOSFET. During operation of a MOSFET, a top portion of the well underneath the gate stack 456 can transport charged carriers from source to drain, and is so called channel of the MOSFET. The gate length L (also referred to as channel length) determines the magnitude of the current of a MOSFET and is scaled down aggressively for logic circuits. The gate length L can be less than about 100 nm. In some implementations, the gate length can be in a range between about 5 nm to about 30 nm. Patterning of the gate stack with such a small dimension is very challenging, and can use techniques including optical proximity correction, double exposure and/or double etching, self-aligned double patterning, etc.

In some implementations, the source/drain 460 of the peripheral device 450 is incorporated with high concentration dopants. For n-type MOSFETs 450-2, the dopant for source/drain 460-2 can include any suitable n-type dopant, such as phosphorus, arsenic, antimony, etc., and/or any combination thereof. For p-type MOSFETs 450-1, the dopant for source/drain 460-1 can include any suitable p-type dopant, for example boron. The dopant incorporation can be achieved through ion implantation followed by dopant activation anneal. The source/drain 460 can be made of the same material as the peripheral substrate 430, for example, silicon. In some implementations, the source/drain 460 of the peripheral device 450 can be made of a different material from the peripheral substrate 430 to achieve high performance. For example, on a silicon substrate, the source/drain 460-1 for a p-type MOSFETs can include SiGe and the source/drain 460-2 for an n-type MOSFETs can be incorporated with carbon. The forming of the source/drain 460 with a different material can include etching back the substrate material in the source/drain area and disposing new source/drain material using techniques such as epitaxy. Doping for source/drain 460 can also be achieved through in-situ doping during epitaxy. In some implementations, the peripheral device 450 (e.g., HV NMOS 450-3) can have a lightly-doped-drain (LDD) 460-3 between the drain 460-2 and the gate stack 456. The LDD 460-3 can reduce electric field when the drain 460-2 is applied with high voltage.

The peripheral device 450 can also have an optional source/drain extension and/or halo region (not shown in FIG. 4A) along each side of the gate stack 456. The source/drain extension and/or halo region locates inside the active device region below the gate stack, and is implemented mainly for improved short channel control for the peripheral device 450 with a channel length less than about 0.5 μm. The forming of the source/drain extension and/or halo region can be similar to the forming of the source/drain 460, but may use different implantation conditions (e.g., dose, angle, energy, species, etc.) to obtain optimized doping profile, depth or concentration.

The peripheral device 450 can be formed on the peripheral substrate 430 with a planar active device region (as shown in FIG. 4A), where the direction of MOSFET's channel and current flow is parallel to a surface of the peripheral substrate 430. In some implementations, the peripheral device 450 can also be formed on the peripheral substrate 430 with a 3D active device region, for example a so-called "FINFET" in a shape like a "FIN" (not shown), where the gate stack of the MOSFET is wrapped around the FIN, and the MOSFET's channel lies along three sides of the FIN (top and two sidewalls under the gate).

In some implementations, the peripheral circuit 400A can include peripheral interconnect structures 462 on the first side 430-1, above the peripheral devices 450, to provide electrical connections between different peripheral devices 450 and external devices (e.g., power supply, another chip, I/O device, etc.). The peripheral interconnect structures 462 can include one or more vertical contact structures 464 and one or more lateral conductive lines 466 (e.g., 466-1, 466-2, etc.). The contact structure 464 and conductive line 466 can broadly include any suitable types of interconnects, such as middle-of-line (MOL) interconnects and back-end-of-line (BEOL) interconnects. The contact structure 464 and conductive line 466 in the peripheral circuit 400A can include any suitable conductive materials such as tungsten (W), cobalt (Co), copper (Cu), titanium (Ti), tantalum (Ta), aluminum (Al), titanium nitride (TiN), tantalum nitride (TaN), nickel, silicides (WSix, CoSix, NiSix, AlSix, etc.), metal alloys, or any combination thereof. The conductive materials can be deposited by one or more thin film deposition processes such as chemical vapor deposition (CVD), plasma-enhanced CVD (PECVD), physical vapor deposition (PVD), atomic layer deposition (ALD), electroplating, electroless plating, sputtering, evaporation, or any combination thereof.

The peripheral circuit 400A can further include a peripheral insulating layer 468. The peripheral insulating layer 468 is disposed over the peripheral interconnect structures 462 to provide insulation and can include insulating materials, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The insulating materials can be deposited by one or more thin film deposition processes such as CVD, PVD, PECVD, ALD, high-density-plasma CVD (HDP-CVD), sputtering, spin-coating, or any combination thereof.

In FIG. 4A, two conductive levels 470-1 and 470-2 (also referred to as "metal levels") are illustrated as an example, where each metal level 470 (e.g., 470-1 or 470-2) include the contact structures 464 and the conductive lines 466. The conductive lines 466 of the same metal level are located at the same distance from the peripheral substrate 430. The number of metal levels 470 for the peripheral circuit 400A is not limited and can be any number optimized for the performance of the 3D memory.

The peripheral interconnect structures 462 can be formed by stacking metal levels 470 from bottom to the top of the peripheral circuit 400A. In the example of the peripheral circuit 400A in FIG. 4A, the bottom metal level 470-1 can be formed first and then the upper metal level 470-2 can be formed on top of the bottom metal level 470-1. Fabrication processes of each metal level 470 can include, but not limited to, disposing a portion of the peripheral insulating layer 468 with a thickness required for the metal level, patterning the portion of the peripheral insulating layer 468 using photo lithography and dry/wet etching to form contact holes for the contact structures 464 and the conductive lines 466, disposing conductive materials to fill the contact holes for the contact structures 464 and the conductive lines 466, and removing excessive conductive materials outside the contact holes by using planarization process such as chemical mechanical polishing (CMP) or reactive ion etching (RIE).

In some implementations, peripheral circuit 400A also includes one or more substrate contacts 472, where the substrate contacts 472 provide electrical connections to the peripheral substrate 430. The substrate contact 472 can include one or more conductive (or metal) levels 470 with multiple tiers of vertical contact structures 464 and lateral conductive lines 466. In FIG. 4A, substrate contact 472 with one tier of contact structure and conductive line is shown as an example, where the vertical contact structure of the substrate contact 472 extends through the peripheral insulating layer 468 and electrically contacts the peripheral substrate 430. In some implementations, the peripheral substrate 430 is p-type and the substrate contact 472 can contact with the p-well 454-2.

In some implementations, the topmost conductive lines 466 (e.g., 466-2 in FIG. 4A) can be exposed as the top surface of the peripheral circuit 400A, where the topmost conductive lines 466-2 can be directly connected with the conductive lines on another chip or an external device.

In some implementations, the topmost conductive lines 466-2 can be embedded inside the peripheral insulating layer 468 (as shown in FIG. 4A), where the insulating material on top of the conductive lines 466 provide scratch protection during shipping or handling. Electrical connections to the topmost conductive lines 466 can be established later by forming metal vertical interconnect accesses (VIAs), or simply by etching back the peripheral insulating layer 468 using dry/wet etching.

The peripheral device 450, however, is not limited to MOSFET. The structures of the other devices, for example diodes, resistors, capacitors, inductors, BJTs, etc., can be formed simultaneously during MOSFETs fabrication through different mask design and layout. To form devices other than MOSFETs, process steps can be added or modified in a MOSFET's process flow, for example, processes to obtain different dopant profiles, film thicknesses or material stacks, etc. In some implementations, the peripheral device 450 other than MOSFET can also be fabricated with additional design and/or lithography mask levels to achieve specific circuit requirements.

In some implementations, a plurality of the peripheral devices 450 can be used to form any digital, analog, and/or mixed-signal circuits for the operation of the peripheral circuit 400A. The peripheral circuit 400A can perform, for example, row/column decoding, timing and control, reading, writing and erasing data of the memory array, etc.

In some implementations, the peripheral circuit 400A can include a low voltage (LV) circuit, a low low voltage (LLV) circuit and a high voltage (HV) circuit. The LV circuit, LLV circuit and the HV circuit can include the peripheral devices 450 (e.g., p-channel MOSFETs 450-1, n-channel MOSFETs 450-2 and/or the HV NMOS 450-3.) In some implementations, the LLV circuit can be configured to operate with a voltage in a range between 0.9 V and 2.0 V. In one example, the LLV circuit can be configured to operate with a voltage about 1.2 V. In some implementations, the LV circuit can be configured to operate with a voltage in a range between 2 V and 3.3 V. In one example, the LV circuit can be configured to operate with a voltage about 3.3 V. In some implementations, the HV circuit can be configured to operate with a voltage greater than 3.3 V, for example, between 5 V and 35 V. In some implementations, the HV circuit can be configured to operate with a voltage in a range from about 15 V to about 35 V, or in a range from about 18 V to about 30 V. It is understood that the voltage ranges described above are for illustrative purposes and are not so limiting. Any other suitable voltage ranges may be used by the LV circuit, the LLV circuit and the HV circuit.

In some implementations, the HV circuit can include one or more drivers that are coupled to the memory array through word lines, bit lines, common source lines, etc., and are configured to drive the memory array by applying a voltage at a suitable level to the word lines, bit lines, common source lines, etc., when performing memory operations (e.g., read, program, or erase). In one example, the HV circuit may include a word-line driver (e.g., in the row decoder/word-line driver 40 in FIGS. 1A and 2) that can apply a program voltage (Vpgm) or a pass voltage (Vpass) in the range of, for example, 10 V and 30 V, to word lines during program operations. In another example, the HV circuit can include a bit-line driver (e.g., in the column decoder/bit-line driver 60 in FIGS. 1A and 2) that can apply an erase voltage ($V_{erase}$) in the range of, for example, 20 V and 35 V, to bit lines during erase operations. In some implementations, the LV circuit can include a page buffer (e.g., in the page buffer/sense amplifier 50 in FIGS. 1A and 2) configured to temporally store data read from or programmed to the memory array. The page buffer can operate under a voltage of, for example, 3.3 V. In some implementations, the LLV circuit can include an I/O circuit (e.g., the I/O buffer 55 in FIG. 2) configured as an interface between a 3D NAND flash memory and a memory controller. The I/O circuit may operate under a voltage of, for example, 1.2 V.

To increase storage capacity in the three-dimensional (3D) memory devices, such as 3D NAND flash memory devices, the number of alternating conductive and dielectric layers in the film stack 335 has been increased greatly. With the increase of the aspect ratio of the 3D structure, the peripheral circuits becomes more complex. The device design and fabrication process for the peripheral circuits can be even more challenging due to size scaling. In one example, the peripheral circuits and the memory array can be fabricated on different substrates, for example, on a "CMOS wafer" and an "array wafer," respectively, and can be bonded together to form the 3D memory device. In some implementations, as described below in connection with the figures, the array wafer can be flipped and face down towards the CMOS wafer for hybrid bonding, so that in the bonded non-monolithic 3D memory device, the array wafer is above the CMOS wafer. It is understood that in some other implementations, the array wafer remains as the substrate of the bonded non-monolithic 3D memory device, and the CMOS wafer is flipped and faces down towards the array wafer for hybrid bonding.

To achieve optimized performance for different circuits, the peripheral circuits can be divided into two or more sets of circuits according to the voltages with which the circuits operate. For example, the peripheral circuits can include a first set of peripheral circuits and a second set of peripheral circuits, wherein the first set of peripheral circuits includes the HV circuits and the second set of peripheral circuits includes the LV circuits and/or LLV circuits.

Figure 4B:
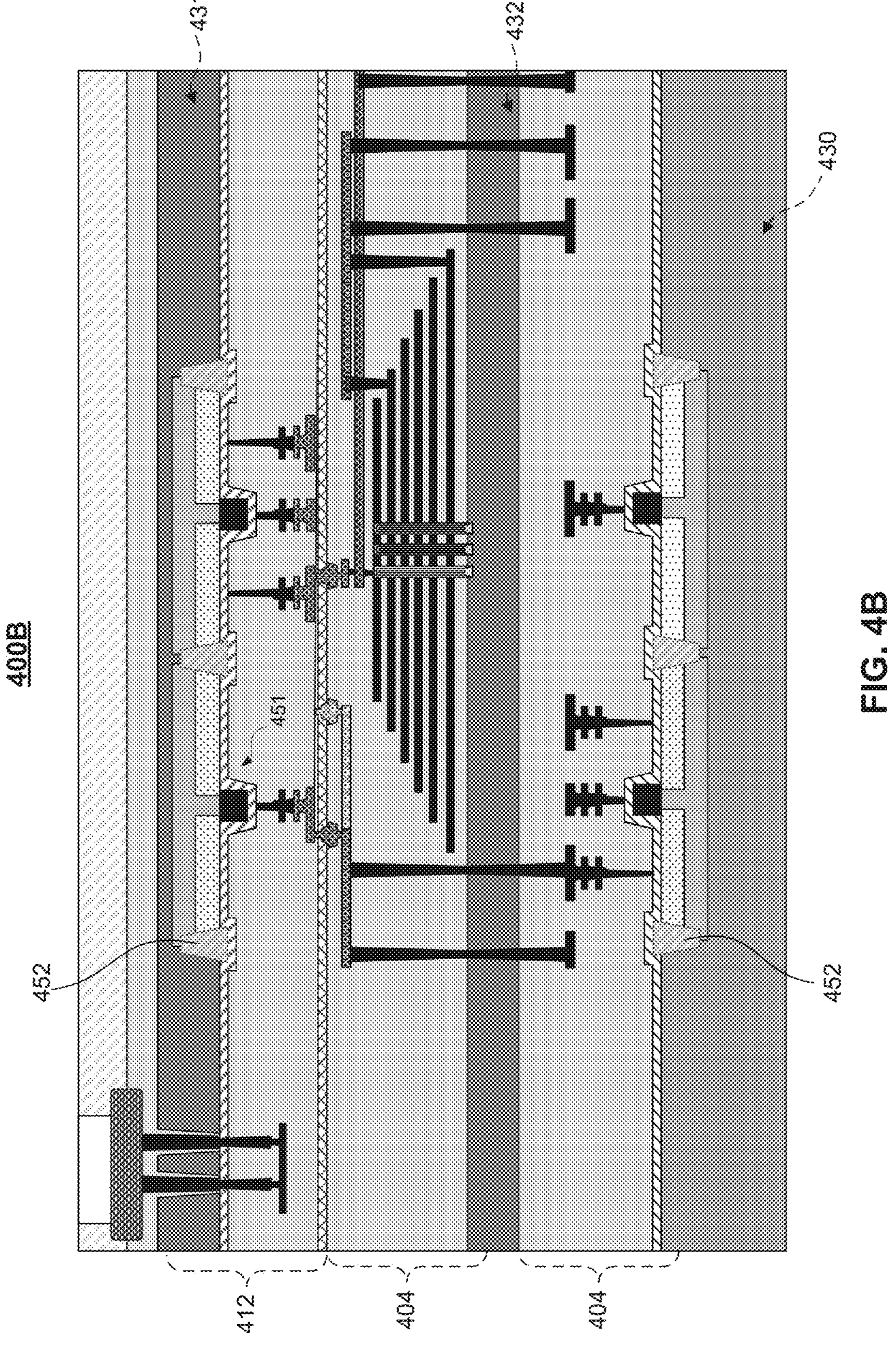
FIGS. 4B and 4C illustrate cross-sectional views of three-dimensional memory devices, according to some implementations of the present disclosure.
Figure 4C:
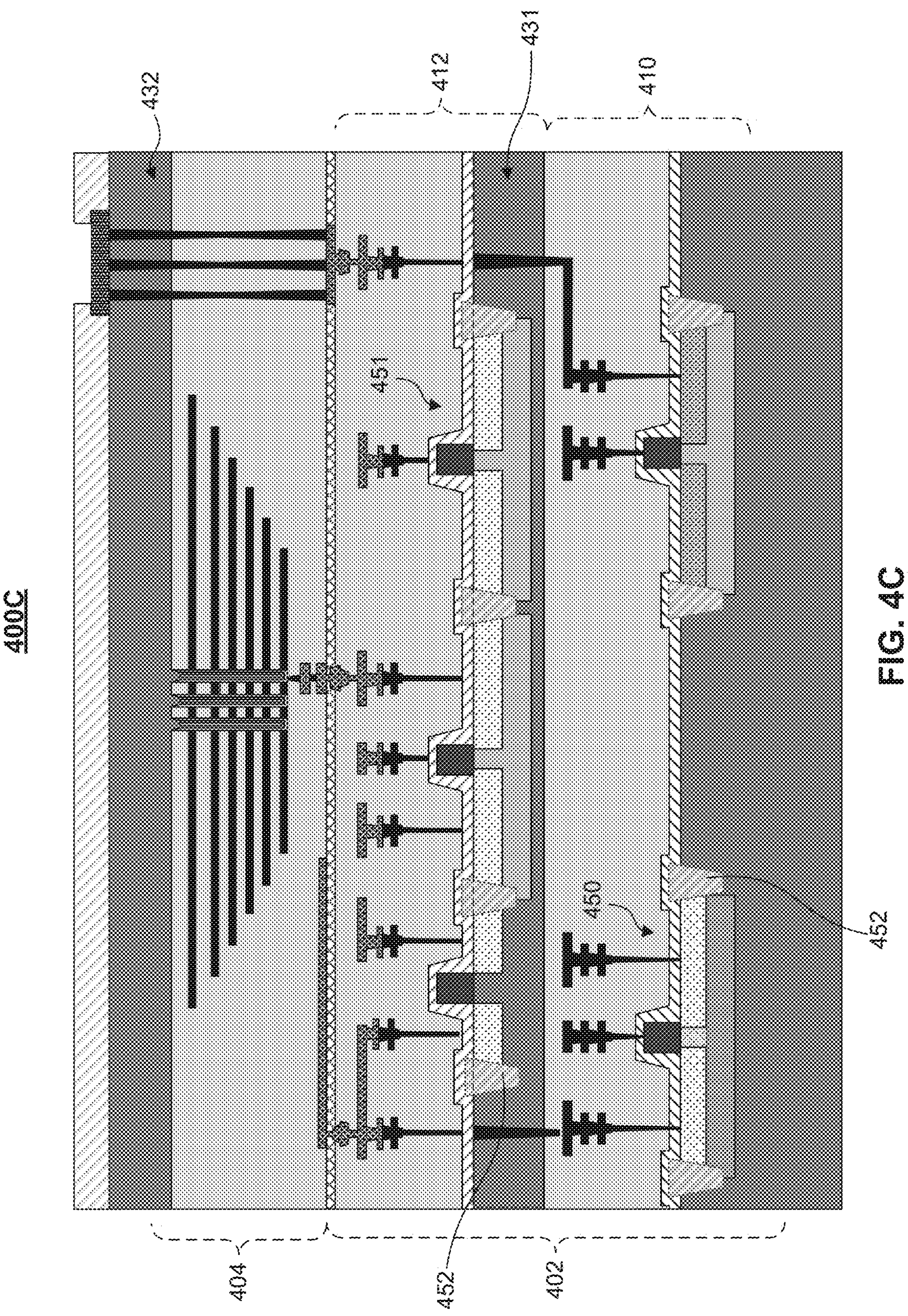

FIGS. 4B and 4C illustrate memory devices 400B and 400C, according to some implementations of the present disclosure. The memory devices 400B and 400C both include a first set of peripheral circuits 410 and a second set of peripheral circuits 412 which can be fabricated on two different substrates (e.g., a first substrate 430 and a second substrate 431) and then can be integrated together through wafer bonding to form functional peripheral circuits like the peripheral circuit 400A shown in FIG. 4A. In one implementation, the first set of peripheral circuits 410 includes the HV circuits and the second set of peripheral circuits 412 includes the LV circuits and/or LLV circuits. The memory devices 400B and 400C also include a memory array 404 fabricated on a third substrate 432. In one implementation, the third substrate 432 includes a thickness in range between 12 μm and 20 μm. In memory device 400B, the memory array 404 can be stacked over the first set of peripheral circuits 410 and the second set of peripheral circuits 412 can be stacked over the memory array 404. In memory device 400C, the second set of peripheral circuits 412 can be stacked over the first set of peripheral circuits 410 and the memory array 404 can be stacked over the second set of peripheral circuits 412. In one implementation, the memory array 404 can be flip-bonded with the second set of peripheral circuits 412. After bonding, the first set of peripheral circuits 410 and the second set of peripheral circuits 412 can support the functions of the memory array 404.

In FIGS. 4B-4C, the memory devices 400B and the memory devices 400C include peripheral devices, e.g., first transistors 450 and second transistors 451, fabricated on the first substrate 430 and the second substrate 431, respectively. The first transistors 450 of the memory devices 400B and the second transistors 451 of the memory devices 400C can include conventional planar MOSFETs (as shown in FIGS. 4B and 4C), where adjacent peripheral devices can be electrically isolated by STI 452. To support HV applications, the first transistors 450 can include a thicker gate dielectric layer than the second transistor 451 and can have a higher threshold voltage. Because the control circuits 70 in FIG. 2 can be built with the second set of peripheral circuits 412, performance of the second transistors 451 can be critical in the overall performance of the memory devices 400B and 400C. As such, it is desirable to further improve the second transistors 451 of the second set of peripheral devices 412, e.g., by forming fully-depleted transistors so as to reduce the short-channel effect and improve switching speed.

Figure 5:
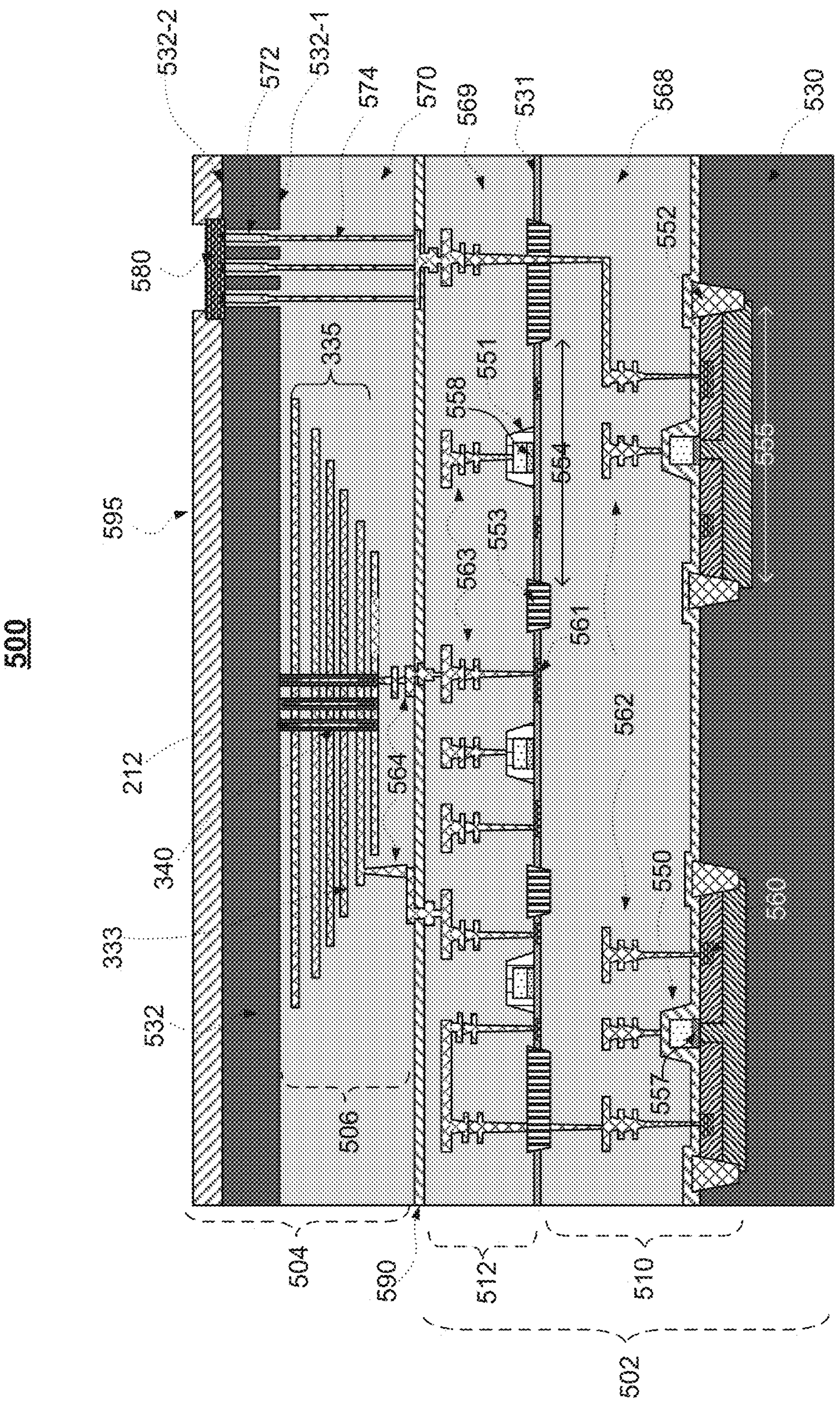
FIG. 5 illustrate a three-dimensional memory device, according to some implementations of the present disclosure.

FIG. 5 illustrates a memory device 500, according to some implementations of the present disclosure. The memory device 500 includes a first semiconductor structure 502 (also referred to as the "CMOS wafer") and a second semiconductor structure 504 (also referred to as the "array wafer"), where the second semiconductor structure 504 is disposed on the first semiconductor structure 502. The second semiconductor structure 504 can include a memory array 506. The first semiconductor structure 502 can include peripheral circuits, similar to the peripheral circuit 400A as shown in FIG. 4A, configured to support operations of the memory array 506. The peripheral circuit 400A in FIG. 4A includes HV, LV and LLV circuits and various peripheral devices 450 that support the HV, LV and LLV circuits, all of which are formed on the substrate 430. In contrast, the peripheral circuits of the first semiconductor structure 502 includes a first set of peripheral circuits 510 and a second set of peripheral circuits 512, wherein the second set of peripheral circuits 512 can be stacked over the first set of peripheral circuits 510 on a first substrate 530. The first set of peripheral circuits 510 configured to operate with a first voltage and the second set of peripheral circuits 512 configured to operate with a second voltage lower than the first voltage. In some implementations, the first voltage can be higher than 3.3 V. The first set of peripheral circuits 510 can include the HV circuit. In some implementations, the second voltage can be less than or equal to 3.3 V and the second set of peripheral circuits 512 can include the LV circuit and the LLV circuit. For example, the first set of peripheral circuits 510 can include a word-line driver and a bit-line driver, and the second set of peripheral circuits can include a page buffer, a sense amplifier and an input/output (I/O) circuit. The first set of peripheral circuits 510 and the second set of peripheral circuits 512 can be similar to the peripheral circuit 400A in FIG. 4A. For simplicity, only the differences will be discussed below.

In some implementations, the second set of peripheral circuits 512 can be disposed over the first set of peripheral circuits 510, and the second semiconductor structure 504 can be disposed over the second set of peripheral circuits 512. The word lines and the bit lines of the memory array 506 can be electrically connected to at least one of the first set of peripheral circuits 510 and the second set of peripheral circuits 512. In the other words, the first set of peripheral circuits 510 and the second set of peripheral circuits 512 in the first semiconductor structure 502 can work together to support the memory operations of the memory cells in the second semiconductor structure 504. In some implementations, the memory device 500 also includes a bonding interface 590 between the first semiconductor structure 502 and the second semiconductor structure 504.

The first set of peripheral circuits 510 includes first transistors 550 and the second set of peripheral circuits 512 includes second transistors 551. The first transistors 550 and the second transistors 551 can have similar structures as the peripheral device 450 described in FIG. 4A. Like the peripheral device 450, the first transistors 550 can include a p-channel MOSFET and/or an n-channel MOSFET. Similarly, the second transistors 551 can also include a p-channel MOSFET and/or an n-channel MOSFET. Each of the first transistors 550 can include a first active device region 555 surrounded by a first isolation structure 552 and each of the second transistors 551 can include a second active device region 554 surrounded by a second isolation structure 553. Similar to the peripheral device 450, each of the first transistors 550 also includes a gate stack having a first gate dielectric layer 557, and each of the second transistors 551 includes a gate stack having a second gate dielectric layer 558. Also like the peripheral device 450, each of the first transistors 550 can include a first source/drain region 560 located on each side of the gate stack, and each of the second transistors 551 can include a second source/drain region 561 located on each side of the gate stack.

To facilitate the first set of peripheral circuits 510 to operate with the first voltage and the second set of peripheral circuits 512 to operate with the second voltage, the first transistors 550 and the second transistors 551 can also operate with the first voltage and the second voltage, respectively. In some implementations, the first transistors 550 can have a first threshold voltage and the second transistors 551 can have a second threshold voltage, where a magnitude of the first threshold voltage is larger than a magnitude of the second threshold voltage. In some implementations, the first transistors 550 can have the first gate dielectric layer 557 and the second transistors 551 can have the second gate dielectric layer 558, where a thickness of the first gate dielectric layer 557 is larger than a thickness of the second gate dielectric layer 558. In some implementation, the thicknesses of the first gate dielectric layer 557 and the second gate dielectric layer 558 refer to physical thicknesses. In some implementation, the thicknesses of the first gate dielectric layer 557 and the second gate dielectric layer 558 refer to an effective thickness of gate dielectric layers, taking into account the dielectric constant k. For example, a dielectric material having higher dielectric constant (e.g., a high-k dielectric material) can have smaller effective thickness than a dielectric material having lower dielectric constant (e.g., a silicon oxide material) even if the physical thicknesses are the same.

In some implementations, the first set of peripheral circuits 510 and the first transistors 550 can be disposed on the first substrate 530 that is similar to the peripheral substrate 430 in FIG. 4A. The second set of peripheral circuits 512 and the second transistors 551 can be disposed on a first semiconductor layer 531. The first semiconductor layer 531 can be disposed over the first set of peripheral circuits 510 and the first transistors 550. In some implementations, the first semiconductor layer 531 has a thickness less than 100 nm. In some implementations, the first semiconductor layer 531 has a thickness in a range between 50 nm and 100 nm. The first semiconductor layer 531 can include silicon (e.g., single crystalline silicon, polycrystalline silicon), silicon germanium (SiGe), germanium (Ge), gallium arsenide (GaAs), gallium nitride, III-V compound, any other suitable materials or any combinations thereof. The first semiconductor layer 531 can be formed by using, for example, chemical vapor deposition, bonding, or smart-cut, chemical mechanical polishing, etc.

In some implementations, the first semiconductor structure 502 also includes one or more first insulating layers 568 (similar to the peripheral insulating layer 468 in FIG. 4A) disposed on the first transistors 550. The first semiconductor structure 502 can also include first interconnect structures 562 (similar to the peripheral interconnect structures 462 in FIG. 4A) disposed in the first insulating layer 568. In some implementations, the first interconnect structures 562 can provide interconnect for at least one of the first set of peripheral circuits 510, the second set of peripheral circuits 512 and the memory array 506. For example, the first interconnect structures 562 can be electrically connected with at least one of the first transistors 550, the second transistors 551 and the memory cells 340.

In some implementations, the first semiconductor structure 502 also includes one or more second insulating layers 569 (similar to the peripheral insulating layer 468 in FIG. 4A) disposed on the second transistors 551 and the first semiconductor layer 531. The first semiconductor structure 502 can also include second interconnect structures 563 (similar to the peripheral interconnect structures 462 in FIG. 4A) disposed in the second insulating layer 569. In some implementations, the second interconnect structures 563 can provide interconnect for at least one of the first set of peripheral circuits 510, the second set of peripheral circuits 512 and the memory array 506. For example, the second interconnect structures 563 can be electrically connected with at least one of the first transistors 550, the second transistors 551 and the memory cells 340. In some implementations, the second interconnect structures 563 and the first interconnect structures 562 can be electrically connected.

In some implementations, the first and second insulating layers 568/569 can include insulating materials, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. In some implementations, the first and second interconnect layer 562/563 can also include one or more interconnect structures, for example, one or more vertical contact structures and one or more lateral conductive lines, which can include any suitable conductive materials such as tungsten (W), cobalt (Co), copper (Cu), titanium (Ti), tantalum (Ta), aluminum (Al), titanium nitride (TiN), tantalum nitride (TaN), nickel, silicides (WSix, CoSix, NiSix, AlSix, etc.), metal alloys, or any combination thereof.

In some implementation, the first set of peripheral circuits 510 includes the first isolation structures 552 that are similar to the STIs 452 in FIG. 4A. In some implementations, the second set of peripheral circuits 512 includes the second isolation structures 553 vertically penetrating through the first semiconductor layer 531 to isolate adjacent second transistors 551. In some implementations, the second isolation structures 553 extend vertically into the first insulating layer 568 and the second insulating layer 569.

In some implementations, the second transistors 551 can be fully-depleted transistors, where at least a portion of the second active device region 554 of the second transistors 551 can be fully depleted during operation. In some implementations, the second source/drain region 561 of each of the second transistors 551 vertically extends through the first semiconductor layer 531. For example, the second source/drain region 561 of each of the second transistors 551 can abut the first insulating layer 568 in a vertical direction perpendicular to the first semiconductor layer 531. It is noted that the second transistors 551 shown in FIG. 5 are planar transistors, wherein the second active device regions 554 are planar, parallel to the first semiconductor layer 531 and the gate stacks (including second gate dielectric layers 558 and gate conductors) are also planar. However, the second transistors 551 are not limited to planar transistors, and can include any suitable three-dimensional transistors, e.g., FINFETs, gate-all-around transistors, transistors of nanowires, etc., where the second active device regions can have three-dimensional structures formed in the first semiconductor layer and the gate stacks can be formed wrapping around the three-dimensional active device region.

The memory array 506 of the second semiconductor structure 504 can include one or more memory blocks 103 as shown in FIGS. 1A and 2 and can have a three-dimensional structure similar to the 3D NAND flash memory 300 as shown in FIG. 3. The memory array 506 includes a film stack of alternating conductive and dielectric layers that is similar to the film stack 335 in FIG. 3. The second semiconductor structure 504 also includes a plurality of memory strings similar to memory strings 212 in FIG. 3, which vertically penetrate through the film stack 335. Each memory string 212 includes vertically stacked memory cells similar to the memory cells 340 in FIG. 3. The memory cell 340 can be formed at an intersection between a memory string and a conductive layer of the film stack 335. The memory array 506 can also include a staircase structure disposed in the film stack 335. Each memory cell 340 can be addressed by a word line and a bit line (similar to the bit line 341 in FIG. 3). The conductive layers of the film stack 335 can function as the gate electrodes of the memory array 506, where some of the gate electrodes can be word lines 333. The word lines and bit lines of the memory array 506 can be electrically connected to the first transistors 550 and/or the second transistors 551 through the second interconnect structures 563 and the first interconnect structures 562. In some implementations, common source lines of the memory array can also be electrically connected to the first transistors 550 and/or the second transistors 551.

The second semiconductor structure 504 can also include a second semiconductor layer 532 disposed on the film stack 335. In some implementations, the second semiconductor layer 532 can be a substrate and can be similar to the peripheral substrate 430 shown in FIG. 4A. The second semiconductor layer 532 can include silicon (e.g., single crystalline silicon, polycrystalline silicon), silicon germanium (SiGe), germanium (Ge), gallium arsenide (GaAs), gallium nitride, III-V compound, any other suitable materials or any combinations thereof. In some implementations, the second semiconductor layer 532 can have a thickness in a range between 0.1 μm to 800 μm. In some implementations, the second semiconductor layer 532 can be thinned using wafer grinding, chemical mechanical polishing, wet/dry etching, etc. In this example, the second semiconductor layer 532 can have a thickness in a range between 12 μm to 20 μm.

In some implementations, the second semiconductor layer 532 can include a first side 532-1 and a second side 532-2. The first and second sides 532-1 and 532-2 are opposite sides of the second semiconductor layer 532. In some implementations, the second semiconductor structure 504 can also include a contact pad 580 disposed on the second side 532-2 of the second semiconductor layer 532, where the contact pad 580 and the film stack 335 are on opposite sides of the second semiconductor layer 532. In some implementations, the second semiconductor structure 504 can also include a through-substrate-interconnect 572. The through-substrate-interconnect 572 vertically penetrates through the second semiconductor layer 532 and the contact pad 580 electrically connected with the through-substrate-interconnect 572. The through-substrate-interconnect 572 can also connected with a contact VIA (vertical-interconnect-access) 574 to connect with the first interconnect structures 562 and the second interconnect structures 563.

The second semiconductor structure 504 can also include a third insulating layer 570 covering the film stack 335. The second semiconductor structure 504 can also include third interconnect structures 564 disposed in the third insulating layer 570. The third interconnect structures 564 can be electrically connected to the word lines and bit lines of the memory cells. The third interconnect structures 564 can also be electrically connected to the first set of peripheral circuits 510 and the second set of peripheral circuits 512 through the first interconnect structures 562 and the second interconnect structures 563. Similar to the first insulating layer 568, the third insulating layer 570 can include insulating materials, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. Similar to the first interconnect structures 562, the third interconnect structures 564 can also include one or more interconnect structures, for example, one or more vertical contact structures and one or more lateral conductive lines, which can include any suitable conductive materials such as tungsten (W), cobalt (Co), copper (Cu), titanium (Ti), tantalum (Ta), aluminum (Al), titanium nitride (TiN), tantalum nitride (TaN), nickel, silicides (WSix, CoSix, NiSix, AlSix, etc.), metal alloys, or any combination thereof.

Referring to FIGS. 6A-6E, flow diagrams of an exemplary method for forming a 3D memory device are illustrated in accordance to some implementations of the present disclosure. It should be understood that the operations and/or steps shown in FIGS. 6A-6E are not exhaustive and that other operations can be performed as well before, after, or between any of the illustrated operations. FIGS. 7-12 illustrate schematic cross-sectional views of an exemplary 3D memory device at certain fabricating stages of the method shown in FIGS. 6A-6E according to some implementations of the present disclosure.

Figure 6A:
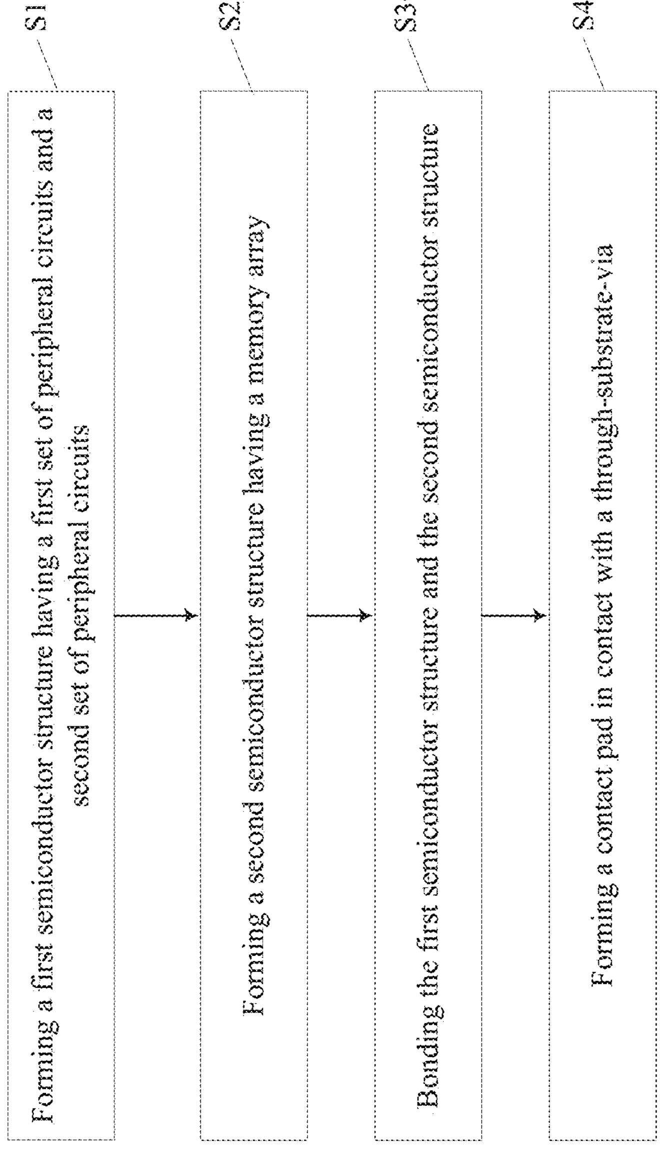
FIGS. 6A-6E illustrate flow diagrams of an exemplary method for forming a 3D memory device, according to some implementations of the present disclosure.

As shown in FIG. 6A, method 600 starts at operation S100, during which the first semiconductor structure 502 (in FIG. 5) including the first set of peripheral circuits 510 and the second set of peripheral circuits 512 can be formed.

Figure 6B:
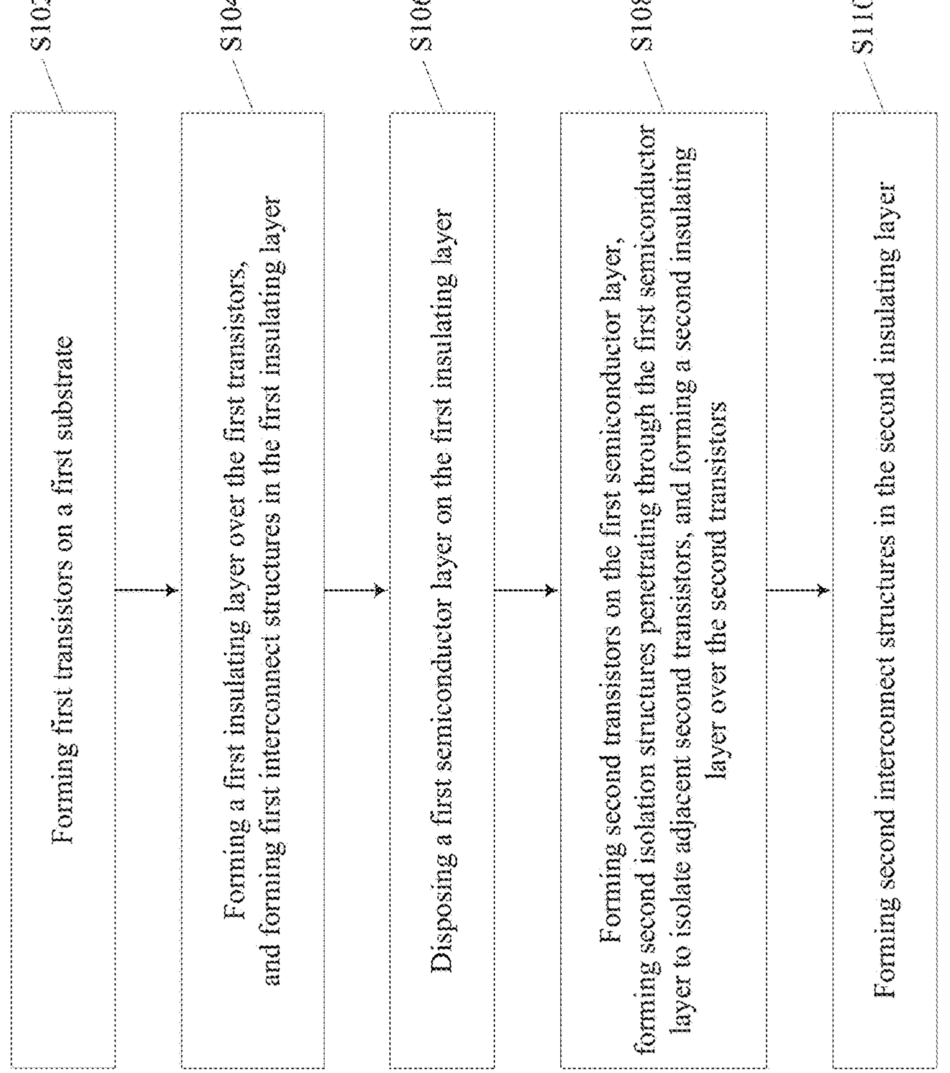
Figure 7:
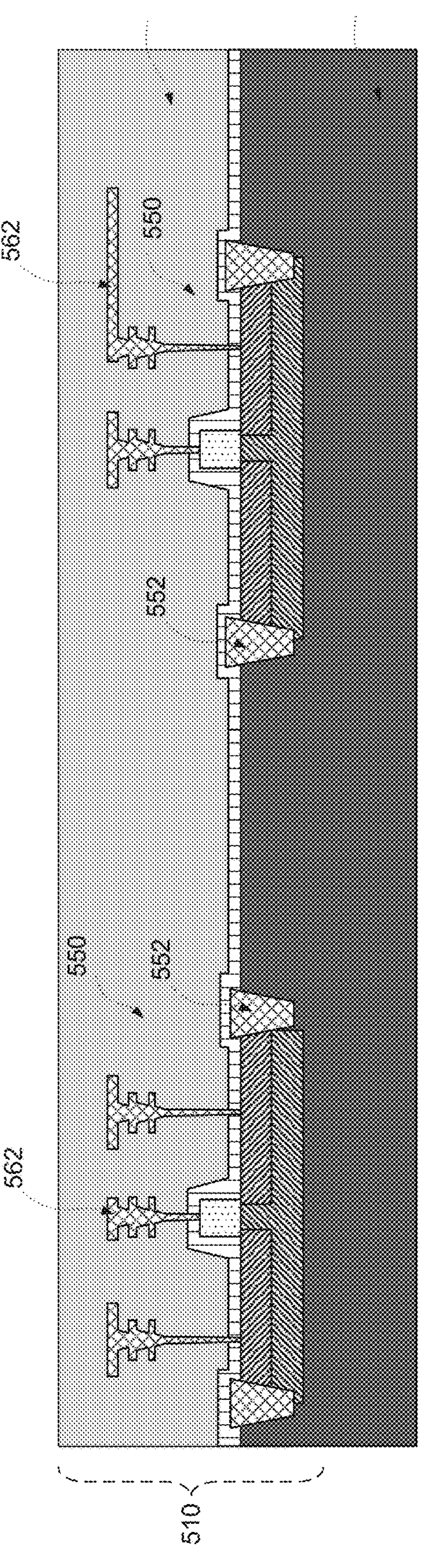
FIGS. 7-12 illustrate schematic cross-sectional views of an exemplary 3D memory device at certain fabricating stages of the method shown in FIGS. 6A-6E according to some implementations of the present disclosure.

The operation S100 can include steps S102-S110 in FIG. 6B. At step S102, the first transistors 550 can be formed on the first substrate 530, where a corresponding structure 700 is shown in FIG. 7. In some implementations, the first substrate 530 can include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. The first substrate 530 can be a single layer substrate or a multi-layer substrate, for example, a monocrystalline single-layer substrate, a polycrystalline silicon (polysilicon) single-layer substrate, a polysilicon and metal multi-layer substrate, etc. In some implementations, the first substrate 530 can be a thinned substrate (e.g., a semiconductor layer), which was thinned by grinding, wet/dry etching, chemical mechanical polishing (CMP), or any combination thereof.

The first transistors 550 on the first substrate 530 can include any suitable HV transistors having an operation voltage higher than 3.3 V, for example, in a range from about 15V to about 35V, or in a range from about 18V to about 30V. The first transistors 550 can be used in the first set of peripheral circuits 510 having an operation voltage higher than 3.3V. In one implementation, the first transistors 550 can have the first gate dielectric layer 557 and the second transistors 551 can have the second gate dielectric layer 558, where a thickness of the first gate dielectric layer 557 is larger than a thickness of the second gate dielectric layer 558. In some implementations, the first isolation structures 552 can be formed in an upper portion of the first substrate 530 to isolate adjacent first transistors 550. The first active device region 555 in the first substrate 530, which is surrounded by the first isolation structures 552, can thereby be formed for each of the first transistors 550. In some implementations, some of the second transistors 551 can also be formed on the first substrate 530.

At step S104, the first insulating layer 568 can be disposed on the first substrate 530 and the first transistors 550. The first interconnect structures 562 can be formed in the first insulating layer 568. The first interconnect structures 562 can be in connection with the first transistors 550. In some implementations, the first insulating layer 568 can be formed by a thin film deposition process, such as ALD, CVD, PVD, any other suitable processes, or any combination thereof. The first insulating layer 568 can include dielectric materials, including, but not limited to, silicon oxide, silicon nitride, silicon oxynitride, or any combination thereof. The first interconnect structures 562 can be formed in the first insulating layer 568 by one or more etching and filling processes. For example, any suitable etching processes can be performed to form openings (e.g., by wet etching and/or dry etching) in portions of the first insulating layer 568 after or between the one or more thin film deposition processes for forming the first insulating layer 568. One or more filling processes can be followed to fill the openings with conductive materials by using ALD, CVD, PVD, any other suitable processes, or any combination thereof. The conductive materials used to form the first interconnect structures 562 can include, but are not limited to, W, Co, Cu, Al, polysilicon, silicides, or any combination thereof. In some implementations, other conductive materials are used to fill the openings to function as a barrier layer, an adhesion layer, and/or a seed layer (not shown).

In some implementations, the first interconnect structures 562 can include multiple layers, and each first interconnect structure 562 can include a plurality of contacts formed in the multiple layers. For example, as shown in FIG. 7, the first interconnect structures 562 can include one or more vertical contacts and horizontal conductive lines that are made by conductive materials including, but not limited to, W, Co, Cu, Al, doped silicon, silicides, or any combination thereof, and can be formed in multiple contact forming processes. For example, fabrication processes to form the plurality of contacts can include forming one or more conductive layers and one or more contact layer in the first insulating layer 568. The conductive layers can be formed by any suitable front-end-of-line (FEOL) methods.

Figure 8:
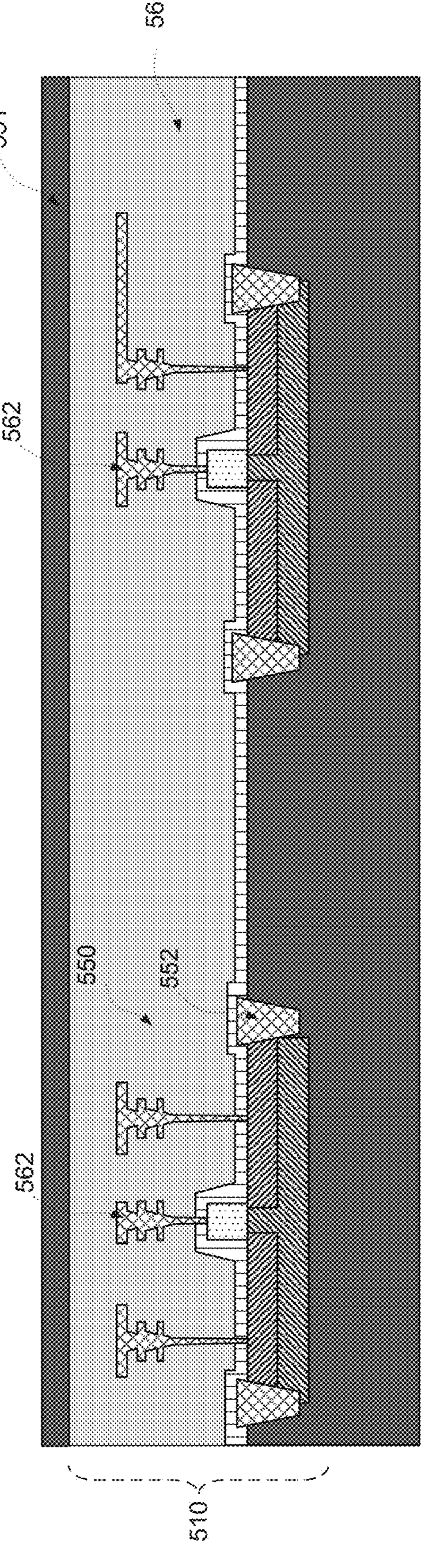

As shown in FIG. 6B, operation S100 can further include step S106 of disposing the first semiconductor layer 531 on the first insulating layer 568 over the first transistors 550 and the first interconnect structures 562. A corresponding structure 800 is shown in FIG. 8. In some implementations, the first semiconductor layer 531 can have a thickness in a range from about 10 nm to about 100 nm. In some implementations, the first semiconductor layer 531 can have a thickness in a range from about 50 nm to about 100 nm. In some implementations, the first semiconductor layer 531 can include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. The first semiconductor layer 531 can be deposited on the first insulating layer 568 by using a thin film deposition process, for example, CVD, ALD, PVD, etc. In some implementations, the first semiconductor layer 531 can be formed by using a bonding process to transfer a thin layer of crystalline silicon or silicon germanium onto the first insulating layer 568. For example, a silicon-on-insulator (SOI) substrate or wafer, which include a thin silicon layer on top of an insulator, can be firstly bonded to the first insulating layer 568 with the thin silicon layer facing the first insulating layer 568. Then the handle wafer on the backside of the SOI substrate can be removed selectively to the insulator. After removing the insulator, the thin silicon layer of the SOI substrate can be transferred. In some implementations, after being bonded to the first insulating layer 568, the first semiconductor layer 531 can be further thinned by grinding, wet/dry etching, chemical mechanical polishing (CMP), smart-cut, or any combination thereof.

Figure 9:
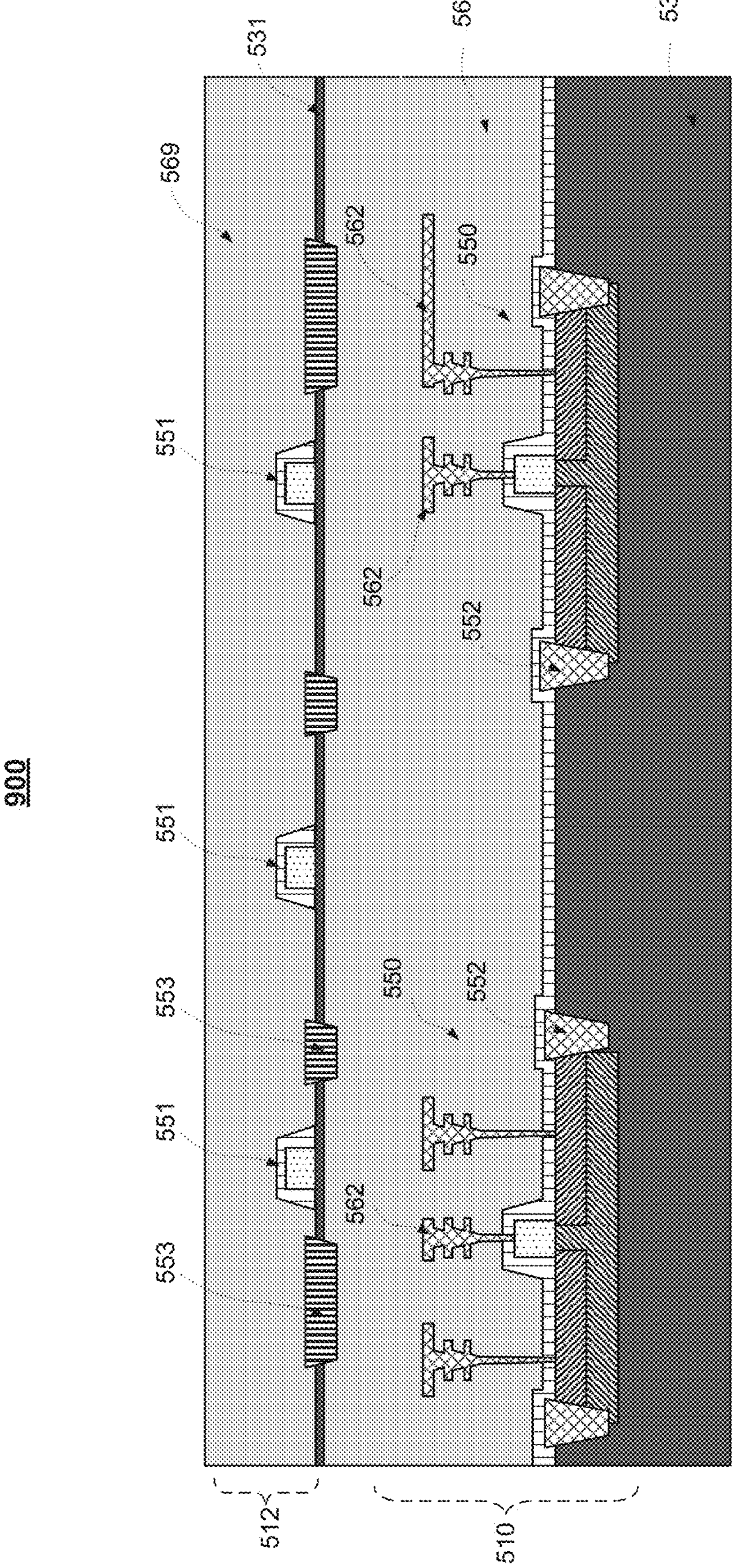

As shown in FIG. 6B, operation S100 can further include step S108, where second transistors 551 can be formed on the first semiconductor layer 531. A corresponding structure 900 is shown in FIG. 9. The second isolation structures 553, which penetrate vertically through the first semiconductor layer 531, can be also formed to isolate adjacent second transistors 551. The second active device region 554 in the first semiconductor layer 531, which is surrounded by the second isolation structures 553, can thereby be formed for each of the second transistors 551. The second insulating layer 569 can be disposed on the first semiconductor layer 531 and the second transistors 551.

In some implementations, the second transistors 551 can be used for the second set of peripheral circuits 512, which includes the LV and LLV circuits having an operation voltage lower than, for example, 3.3V. For example, the second transistors 551 can having an operation voltage in a range from about 2.2V to about 3.3V. In some implementations, the second transistors 551 can have an operation voltage in a range from about 0.9V to about 1.8V. The second transistors 551 can be used in the second set of peripheral circuits 512 that requires an operation voltage lower than that of the first set of peripheral circuits 510. In some implementations, the second transistors 551 can be used for page buffers, decoders (e.g., the row and/or column decoders), latches, input/output signal circuits, etc. When the first semiconductor layer 531 has a thickness less than, for example 100 nm, the second transistors 551 formed on the first semiconductor layer 531 can be fully-depleted transistors, where at least a portion of the second active device region 554 of the second transistor 551 can be fully depleted during the operation. Fully-depleted transistors can minimize short channel effect and provide fast switch speed.

In some implementations, the second insulating layer 569 can be formed on the first semiconductor layer 531 and the second transistors 551, by using a thin film deposition process such as ALD, CVD, PVD or any combination thereof. The second insulating layer 569 can include dielectric materials, including, but not limited to, silicon oxide, silicon nitride, silicon oxynitride, or any combination thereof.

Figure 10:
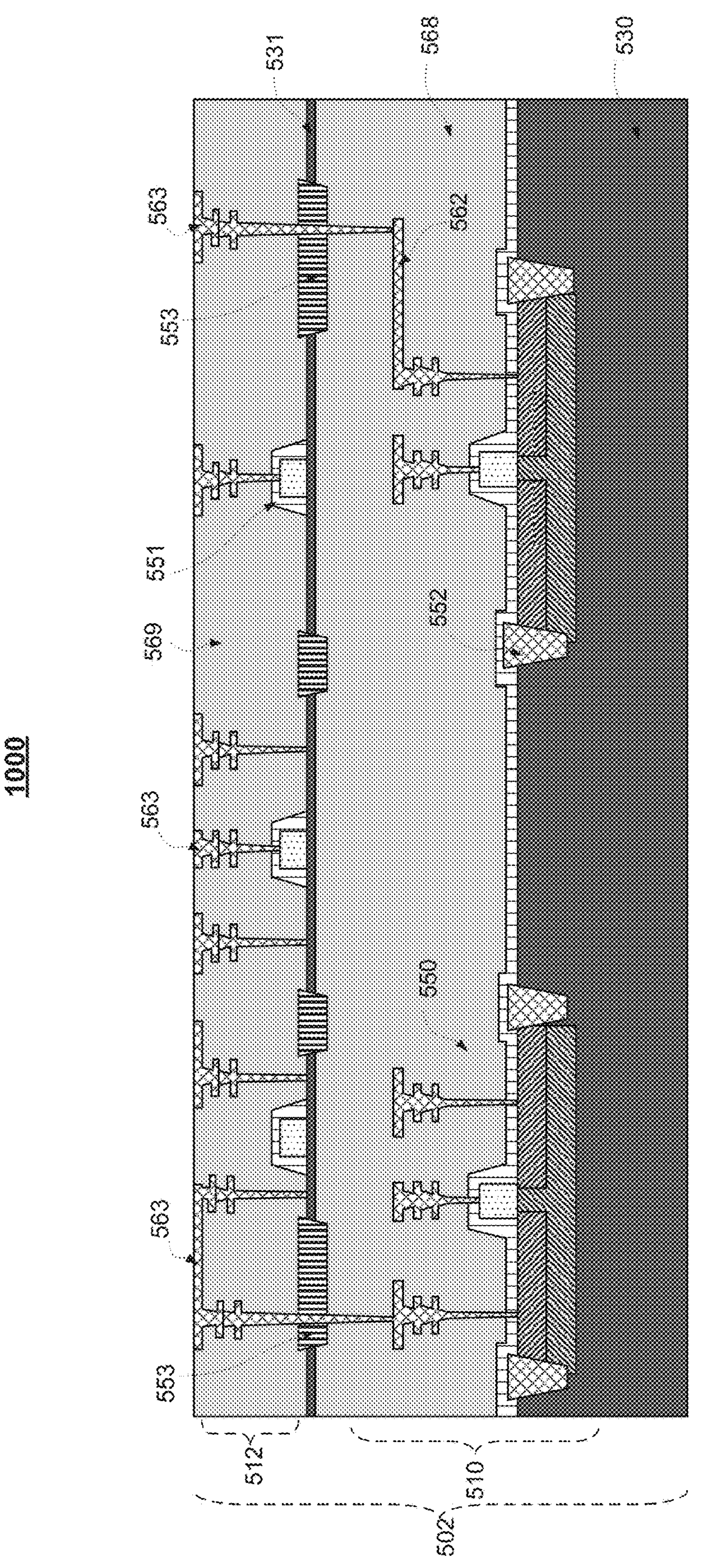

As shown in FIG. 6B, operation S100 can further include step S110 of forming second interconnect structures 563 in the second insulating layer 569. A corresponding structure 1000 is shown in FIG. 10. Some portions of the second interconnect structures 563 can be electrically connected with the second transistors 220. Some portions of the second interconnect structures 563 can be electrically connected to the first transistors 550 through one or more of the first interconnect structures 562.

The second interconnect structures 563 can be formed in the second insulating layer 569 by one or more etching and filling processes. For example, any suitable etching processes can be performed to form openings (e.g., by wet etching and/or dry etching) in portions of the second insulating layer 569 after or between the one or more thin film deposition processes for forming the second insulating layer 569. One or more filling processes can be followed to fill the openings with conductive materials by using ALD, CVD, PVD, any other suitable processes, or any combination thereof. The conductive materials used to form the second interconnect structures 563 can include, but are not limited to, W, Co, Cu, Al, polysilicon, silicides, or any combination thereof. In some implementations, other conductive materials are used to fill the openings to function as a barrier layer, an adhesion layer, and/or a seed layer (not shown).

In some implementations, the second interconnect structures 563 can include multiple layers, and each second interconnect structure 563 can include a plurality of contacts formed in the multiple layers. For example, as shown in FIG. 10, the second interconnect structures 563 can include one or more contacts, single-layer/multi-layer vias, conductive lines, plugs, pads, and/or any other suitable conductive structures that are made by conductive materials including, but not limited to, W, Co, Cu, Al, doped silicon, silicides, or any combination thereof, and can be formed in multiple contact forming processes. For example, fabrication processes to form the plurality of contacts can include forming one or more conductive layers and one or more contact layer in the second insulating layer 569. The conductive layers can be formed by any suitable front-end-of-line (FEOL) methods.

In some implementations, the second interconnect structures 563 can penetrate through the second isolation structures 553 and can be electrically connected to the first transistors 550 through one or more first interconnect structures 562. In such case, an etching process can be performed to form one or more openings penetrating the second isolation structures 553 and up portions of the first insulating layer 568 to expose an upper surface of one or more first interconnect structures 562. A conductive material can be filled in the one or more openings to form the second interconnect structures 563 that penetrate the second isolation structures 553 and be in contact with the one or more first interconnect structures 562.

As shown in FIG. 10, the first semiconductor structure 502 can include: the first substrate 530; the first transistors 550 formed on the first substrate 530; the first insulating layer 568 on the first substrate 530 and the first transistors 550; the first interconnect structures 562 in connection with the first transistors 550; the first semiconductor layer 531 on the first insulating layer 568; the second transistors 551 formed on the first semiconductor layer 531; the second isolation structures 553 that penetrate through the first semiconductor layer 531 and isolate adjacent second transistors 551; the second insulating layer 569 on the second transistors 551, the first semiconductor layer 531, the second isolation structures 553 and the second interconnect structures 563; and the second interconnect structures 563 electrically connected with the second transistors 551 and/or the first transistors 550 through the first interconnect structures 562.

Figure 11:
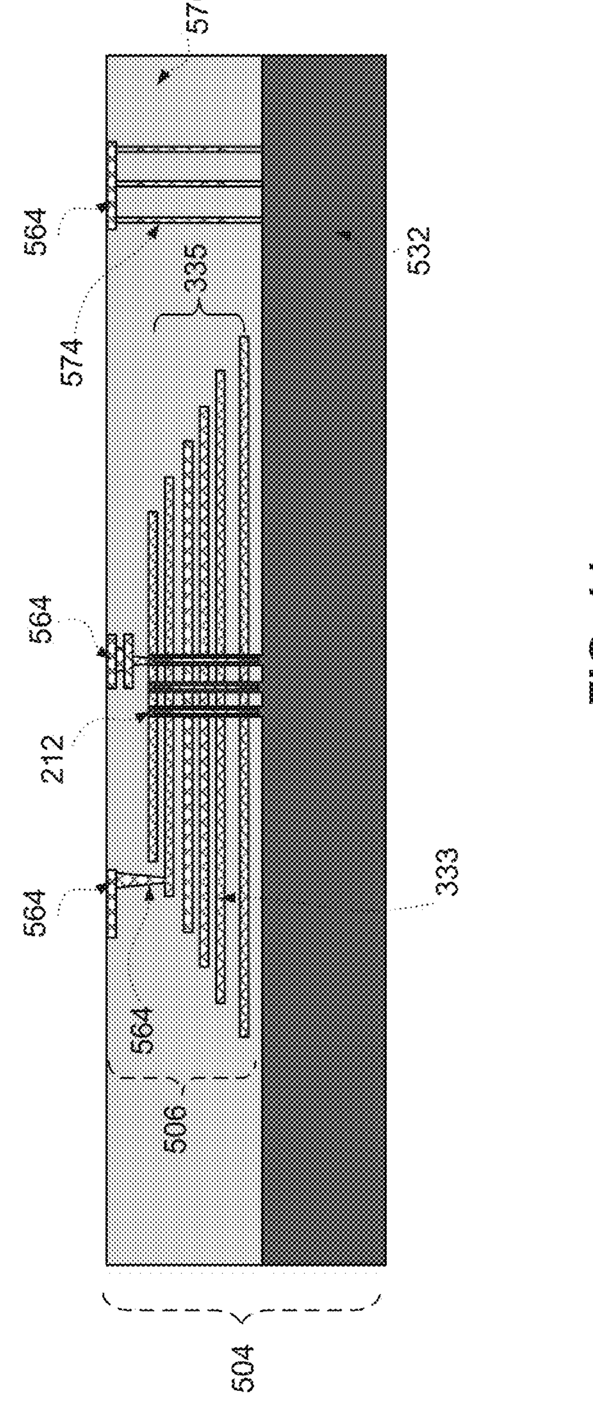

Referring to FIG. 6A, the method 600 includes operation S200. At the operation S200, the second semiconductor structure 504 having the memory array 506 can be formed. A corresponding structure 1100 is shown in FIG. 11. In some implementations, the memory array 506, which includes the memory strings 212 and the staircase structure, can be formed on the second semiconductor layer 532. The third insulating layer 570 can be disposed on the second semiconductor layer 532 and the memory array 506. The contact VIA 574 for the through-substrate-interconnect 572 can be formed in the third insulating layer 570. The third interconnect structures 564 can be formed in the third insulating layer 570 to electrically connect with the memory strings 212, conductive layers of the staircase structure (e.g., connecting with word lines), channel plugs connecting with top portions of the channel layers of the memory strings 212 (e.g., connecting with bit lines) and the contact VIA 574.

Figure 6C:
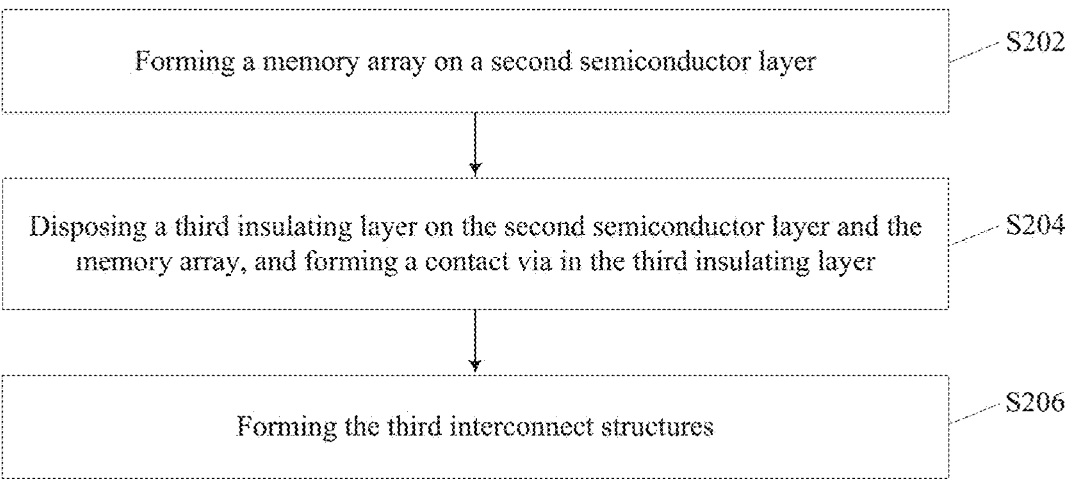
Figure 6D:
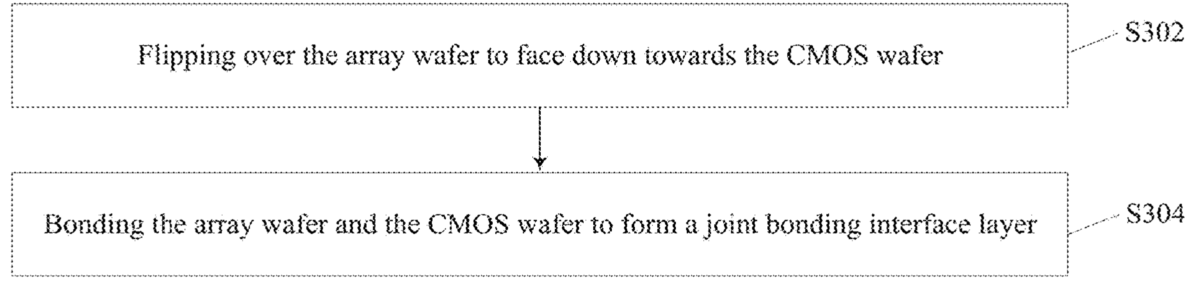

The operation S200 can include steps S202-S206 in FIG. 6C. At step S202, the memory array 506 can be formed on the second semiconductor layer 532.

In some implementations, the second semiconductor layer 532 can be a substrate and can include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some implementations, the second semiconductor layer 532 can be a thinned substrate, where the thinning process can include grinding, wet/dry etching, chemical mechanical polishing (CMP), or any combination thereof. In some implementations, the second semiconductor layer 532 can be a single layer substrate or a multi-layer substrate, for example, a monocrystalline single-layer substrate, a polycrystalline silicon (polysilicon) single-layer substrate, a polysilicon and metal multi-layer substrate, etc.

In some implementations, the memory array 506 can include the 3D NAND flash memory 300 in FIG. 3, which includes NAND strings 212 (also referred as memory strings 212) extending vertically through the film stack 335 of alternating conductive and dielectric layers on the second semiconductor layer 532. The number of the conductive and dielectric layer pairs in film stack 335 (e.g., 64, 96, 128, etc.) can determine the number of memory cells in the memory array 506. The conductive layers and dielectric layers in the film stack 335 can be arranged alternately in the vertical direction. Conductive layers can each have the same thickness or have different thicknesses. Similarly, dielectric layers can each have the same thickness or have different thicknesses. Conductive layers can include conductive materials including, but not limited to, tungsten (W), cobalt (Co), copper (Cu), aluminum (Al), polycrystalline silicon (polysilicon), doped silicon, silicides, or any combination thereof. Dielectric layers can include dielectric materials including, but not limited to, silicon oxide, silicon nitride, silicon oxynitride, or any combination thereof. In some implementations, the conductive layers include metal layers, such as W, and dielectric layers include silicon oxide. In some implementations, the conductive layers in film stack 335 can function as word lines 333 for the memory cells.

As shown in FIG. 11, on one or more sides in the lateral direction, the film stack 335 can include one or more staircase structures. Each level of staircase structure can include one or more conductive and dielectric layer pairs, each including a conductive layer and a dielectric layer. The top layer in each level of staircase structure can be the conductive layer for interconnection in the vertical direction. In some implementations, each two adjacent levels of staircase structure are offset by a nominally same distance in the vertical direction and a nominally same distance in the lateral direction. For each two adjacent levels of staircase structure, the first level that is closer to the second semiconductor layer 532 can extend laterally further than the second level, thereby forming a "landing area" on the first level for interconnection in the vertical direction.

In some implementations, each NAND string 212 can include a memory film and a channel layer that extend vertically through film stack 335. In some implementations, the channel layer includes silicon, such as amorphous silicon, polysilicon, or single crystalline silicon. In some implementations, the memory film surrounding an outer surface of the channel layer is a composite layer, including a tunneling layer, a storage layer (also known as "charge trap/storage layer"), and a blocking layer. Each NAND string 212 can have a cylinder shape (e.g., a pillar shape). The semiconductor channel, the tunneling layer, the storage layer, and the blocking layer are arranged along a direction from the center toward the outer surface of the pillar in this order, according to some implementations. The tunneling layer can include silicon oxide, silicon nitride, or any combination thereof. The storage layer can include silicon nitride, silicon oxynitride, silicon, or any combination thereof. The blocking layer can include silicon oxide, silicon nitride, high dielectric constant (high-k) dielectrics, or any combination thereof.

As shown in FIG. 6C, the operation S200 can further include step S204 of forming the third insulating layer 570 on the second semiconductor layer 532 and the memory array 506, and forming the contact VIA 574 in the third insulating layer 570. In some implementations, the contact VIA 574 can be electrically connected with the word lines, bit lines (or channel plugs connecting with the channel layers of NAND strings 212), and/or the second semiconductor layer 532. In one implementation, the contact VIA 574 penetrating vertically through the third insulating layer 570.

As shown in FIG. 11, in some implementations, the third insulating layer 570 can be formed to cover the second semiconductor layer 532 and the memory array 506 by using a thin film deposition process, such as ALD, CVD, PVD, etc., or any combination thereof. The third insulating layer 570 can include dielectric materials, including, but not limited to, silicon oxide, silicon nitride, silicon oxynitride, or any combination thereof. A CMP process can be performed to planarize the top surface of the third insulating layer 570.

In some implementations, the contact VIA 574 can include an opening (e.g., a VIA hole or a trench) filled with conductive materials including, but not limited to, W, Co, Cu, Al, silicides, or any combination thereof. The contact VIA 574 can be formed by using processes, for example, photolithography, etching, thin film deposition, and CMP. For example, vertical opens can be formed first by wet etching and/or dry etching, followed by filling the vertical openings with conductive materials using ALD, CVD, PVD, any other suitable processes, or any combination thereof.

As shown in FIG. 6C, the operation S200 can further include step S206 of forming the third interconnect structures 564. The third interconnect structures 564 can be formed in the third insulating layer 570. The third interconnect structures 564 can be electrically connected with the word lines 333, the bit lines, and/or the contact VIA 574. Namely, the memory cells of the memory strings 212 in the memory array 506 can be coupled to the third interconnect structures 564. The third interconnect structures 564 can be formed by one or more etching and filling processes. For example, any suitable etching processes can be performed to form openings (e.g., by wet etching and/or dry etching) in portions of the third insulating layer 570 after or between the one or more thin film deposition processes for forming the third insulating layer 570. One or more filling processes can be followed to fill the openings with conductive materials by using ALD, CVD, PVD, any other suitable processes, or any combination thereof. The conductive materials used to form the plurality of third interconnect structures 564 can include, but are not limited to, W, Co, Cu, Al, polysilicon, silicides, or any combination thereof. In some implementations, other conductive materials are used to fill the openings to function as a barrier layer, an adhesion layer, and/or a seed layer (not shown).

In some implementations, the third interconnect structures 564 can include multiple layers, and each third interconnect structure 564 can include a plurality of contacts formed in the multiple layers. For example, as shown in FIG. 11, the third interconnect structures 564 can include one or more contacts, single-layer/multi-layer vias, conductive lines, plugs, pads, and/or any other suitable conductive structures that are made by conductive materials including, but not limited to, W, Co, Cu, Al, doped silicon, silicides, or any combination thereof, and can be formed in multiple contact forming processes. For example, fabrication processes to form the plurality of contacts can include forming one or more conductive layers and one or more contact layer in the third insulating layer 570. The conductive layers can be formed by any suitable back-end-of-line (BEOL) methods.

Referring to FIG. 6A, the method 600 also includes operation S300. At operation S300, the second semiconductor structure 504 can be flipped and bonded with the first semiconductor structure 502. The operation S300 can include steps S302-S304 in FIG. 6D. At step S302, the second semiconductor structure 504 can be flipped face down towards the first semiconductor structure 502. As such, the exposed surface of the second semiconductor layer 532 becomes the top surface of the second semiconductor structure 504, and the exposed surface of the third insulating layer 570 and the exposed surfaces of the third interconnect structures 564 can become the bottom surface of second semiconductor structure 504.

Operation S300 can further include step S304 of bonding the second semiconductor structure 504 and the first semiconductor structure 502 together to form the memory device 500. The corresponding structure 1200 is shown again in FIG. 12, where structure 1200 is similar to the memory device 500 in FIG. 5. In some implementation, the structure 1200 (also referred to as memory device 1200) includes a bonding interface 590. The bonding interface 590 is between the bottom surface of the second semiconductor structure 504 and the top surface of the first semiconductor structure 502. Therefore, the bonding interface 590 includes dielectric interface portions between two dielectric layers (e.g., sandwiched between the second insulating layer 569 and the third insulating layer 570), and conductive interface portions between two conductive layers (e.g., sandwiched between the second interconnect structures 563 and the third interconnect structures 564).

In some implementations, the conductive interface portions of the bonding interface 590 can include any suitable conductive materials including, but not limited to, W, Co, Cu, Al, doped silicon, silicides, or any combination thereof. In some implementations, the material of dielectric interface portions of the bonding interface 590 can be different from the material of the second insulating layer 569 and the third insulating layer 570. In some implementations, the dielectric interface portions of the bonding interface 590 can include carbon nitride material and can act as a protection layer or a block layer to eliminate the metal diffusion of the conductive interface portions of the bonding interface 590, the second interconnect structures 563, and the third interconnect structures 564.

In some implementations, the hybrid bonding between the second semiconductor structure 504 and the first semiconductor structure 502 can include any suitable bonding processes or combinations thereof. For example, the bonding interface can be formed by chemical bonds between the dielectric layers and/or the conductive layers on both sides of the bonding interface. As another example, the bonding interface can be formed by physical interaction (e.g., interdiffusion) between the dielectric layers and/or the conductive layers on both sides of the bonding interface. In some implementations, the bonding interface can be formed after a plasma treatment or a thermal treatment of the surfaces from both sides of the bonding interface prior to the bonding process.

Figure 12:
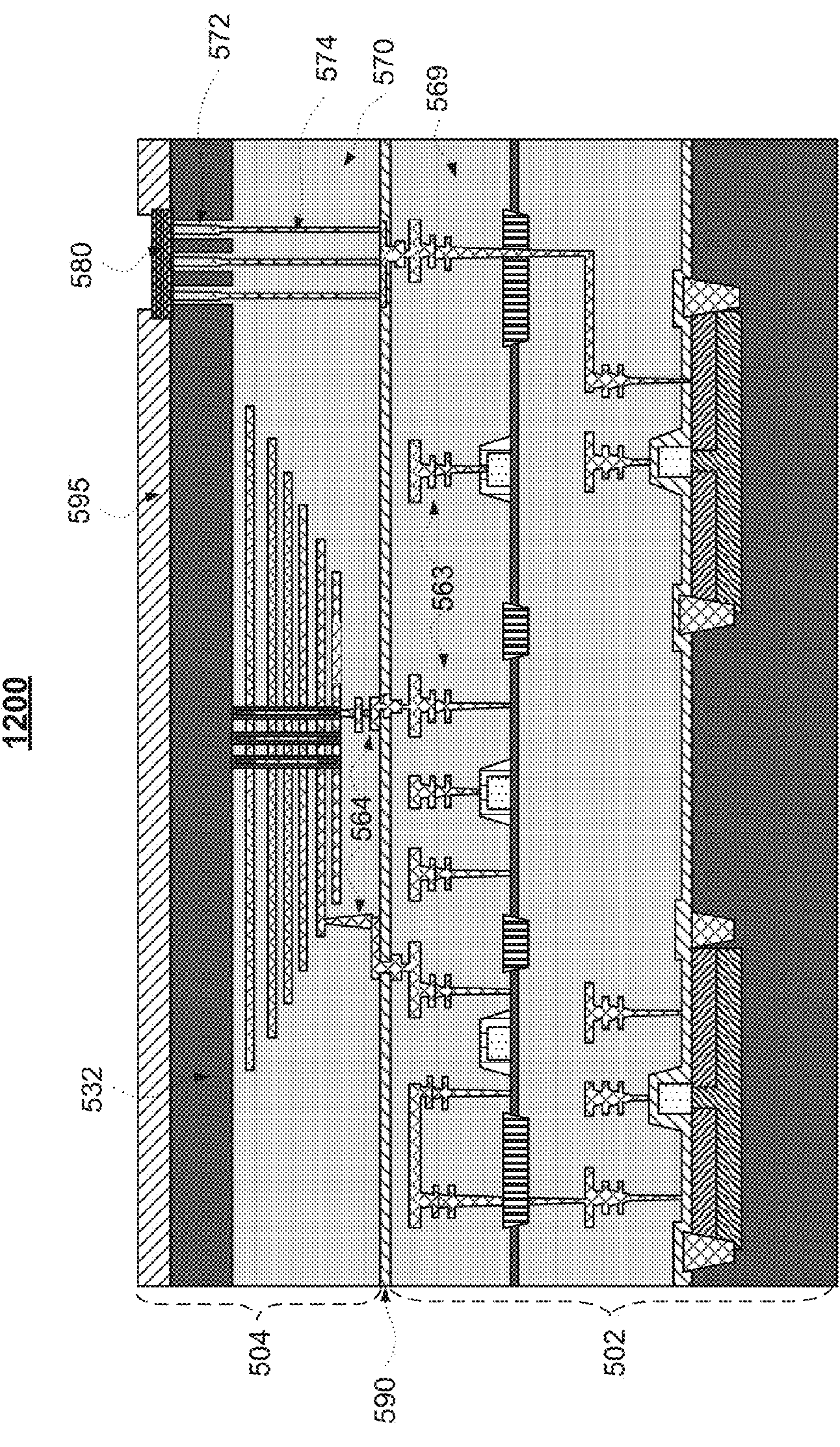

Referring to FIG. 6A, the method 600 also include operation S400. At the operation S400, the contact pad 580 can be formed to contact with the through-substrate-interconnect 572 as shown in FIG. 12. The operation S400 can include steps S402-S406 in FIG. 6E. At step S402, the second semiconductor layer 532 can be thinned down. In some implementations, the second semiconductor layer 532 can be thinned by processes including, but not limited to, wafer grinding, dry etch, wet etch, CMP, any other suitable processes, or any combination thereof. In some other implementations, the original second semiconductor layer 532 can be completely removed and replaced by a new second semiconductor layer 532 with different semiconductor material (e.g., polysilicon).

Figure 6E:
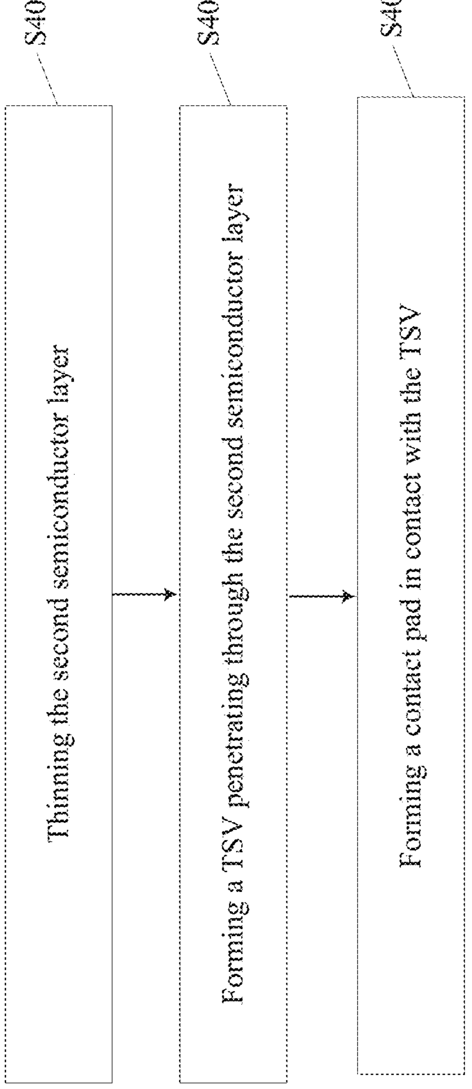

As shown in FIG. 6E, the operation S400 can include step S404 of forming the through-substrate-interconnect 572 penetrating through the second semiconductor layer 532. As shown in FIG. 12, in some implementations, the through-substrate-interconnect 572 can contact with the contact VIA 574. The through-substrate-interconnect 572 can be formed by any suitable contact forming method that include multiple processes, for example, photolithography, etching, thin film deposition, and CMP. In some implementations, a vertical opening through the second semiconductor layer 532 can be formed by any suitable method (e.g., a wet etching, a dry etching, and/or a plasma etch, etc.) to expose the through-substrate-interconnect 572. A subsequent deposition process can fill the vertical opening with conductive materials using ALD, CVD, PVD, any other suitable processes, or any combination thereof. The conductive materials used for filling the vertical opening can include, but are not limited to, W, Co, Cu, Al, polysilicon, silicides, or any combination thereof. In some implementations, other conductive materials can also be used as a barrier layer, an adhesion layer, and/or a seed layer.

As shown in FIG. 6E, the operation S400 can further include step S406 of forming the contact pad 580 in contact with the through-substrate-interconnect 572. It is understood that, a contact process for forming the contact pad 580 can include multiple processes, for example, photolithography, etching, thin film deposition, and CMP. In some implementations, a hard mask layer (not shown) can be formed on the second semiconductor layer 532, and at least one vertical opening can be formed in the hard mask layer by a wet etching and/or dry etching by using the hard mask layer. As such, the end surface of the through-substrate-interconnect 572 can be exposed by the vertical opening. A subsequent deposition process can be used to fill the vertical opening with conductive materials, for example, by using ALD, CVD, PVD, any other suitable processes, or any combination thereof. The conductive materials used for the contact pad 580 can include, but are not limited to, W, Co, Cu, Al, polysilicon, silicides, or any combination thereof. In some implementations, other conductive materials can also be used as a barrier layer, an adhesion layer, and/or a seed layer. A protecting layer 595 can be formed on the second semiconductor layer 532, and a contact opening can be formed to expose the contact pad 580. The protecting layer 595 can include any suitable insulating material, for example, silicon oxide, silicon nitride, silicon oxynitride, polymer, polyimide, spin-on-glass, etc.

Accordingly, a 3D memory device and a fabricating method thereof are provided. In the disclosed 3D memory device, HV CMOS devices (e.g., the first transistors) can be formed on a first substrate, and fully-depleted LV/LLV devices (e.g., the second transistors) can be formed on a first semiconductor layer (e.g., a SiGe layer) with a thickness less than the depletion width of the second transistors. By using the fully-depleted transistors and isolation structures penetrating through the first semiconductor layer, parasitic capacitances can be reduced and the device performance of the 3D memory device can be significantly improved. Furthermore, by forming the contact pad on the back side of the memory array, the periphery circuits of the 3D memory device can be connected out from the back side of the 3D memory device. Thus, the size of the 3D memory device can be reduced and the integration degree of the 3D memory device can be increased.

In summary, the present disclosure provides a method for forming a three-dimensional (3D) memory device. The method includes forming a first semiconductor structure and a second semiconductor structure and then bonding the second semiconductor structure and the first semiconductor structure to form the 3D memory device. The forming of the first semiconductor structure includes forming a first transistor on a first substrate, disposing a first semiconductor layer over the first transistor, and forming a second transistor on the first semiconductor layer. The first transistor includes a first gate dielectric layer and the second transistor includes a second gate dielectric layer having a thickness less than a thickness of the first gate dielectric layer. The second semiconductor structure includes memory cells.

The present disclosure also provides a memory device having a first semiconductor structure and a second semiconductor structure disposed on the first semiconductor structure. The first semiconductor structure includes a first transistor having a first gate dielectric layer, a first semiconductor layer disposed on the first transistor, and a second transistor disposed on the first semiconductor layer. The second transistor includes a second gate dielectric layer having a thickness less than a thickness of the first gate dielectric layer. The second semiconductor structure includes memory cells coupled to the first transistor and the second transistor.

The present disclosure further provides a memory device having a first semiconductor structure and a second semiconductor structure. The first semiconductor structure includes a first set of peripheral circuits having a first transistor configured to operate with a first voltage, and a second set of peripheral circuits having a second transistor configured to operate with a second voltage lower than the first voltage. The second set of peripheral circuits are disposed over the first set of peripheral circuits. The second semiconductor structure includes memory cells coupled to the first semiconductor structure.

The present disclosure also provides a storage system including a memory controller and a memory device. The memory device includes a first semiconductor structure having a first set of peripheral circuits configured to operate with a first voltage, and a second set of peripheral circuits configured to operate with a second voltage lower than the first voltage. The second set of peripheral circuits are disposed over the first set of peripheral circuits. The memory device also includes a second semiconductor structure disposed on the first semiconductor structure, wherein the second semiconductor structure includes memory cells coupled to the first semiconductor structure.

Other aspects of the present disclosure can be understood by those skilled in the art in light of the description, the claims, and the drawings of the present disclosure.

The foregoing description of the specific implementations will so fully reveal the general nature of the present disclosure that others can, by applying knowledge within the skill of the art, readily modify and/or adapt for various applications such specific implementations, without undue experimentation, without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary implementations of the present disclosure as contemplated by the inventor(s), and thus, are not intended to limit the present disclosure and the appended claims in any way.

The breadth and scope of the present disclosure should not be limited by any of the above-described exemplary implementations, but should be defined only in accordance with the following claims and their equivalents.

What is claimed is:

1. A memory device, comprising:
- a first semiconductor structure, comprising:
  - a first transistor comprising a first gate dielectric layer;
  - a first semiconductor layer disposed on the first transistor;
  - an isolation structure vertically penetrating through the first semiconductor layer to electrically isolate a second transistor;
  - a first insulating layer disposed on the first transistor;
  - first interconnect structures disposed in the first insulating layer, wherein at least one of the first interconnect structures is electrically connected with the first transistor;
  - the second transistor, disposed on and in the first semiconductor layer, wherein the second transistor comprises a second gate dielectric layer having a thickness less than a thickness of the first gate dielectric layer;
  - a second insulating layer disposed on the second transistor;
  - second interconnect structures disposed in the second insulating layer, wherein at least one of the second interconnect structures is electrically connected with the second transistor, wherein at least one of the second interconnect structures is connected with at least one of the first interconnect structures by extending through the isolation structure; and
- a second semiconductor structure disposed on the first semiconductor structure, wherein the second semiconductor structure comprises memory cells coupled to the first transistor and the second transistor.

2. The memory device of claim 1, wherein the first transistor is configured to operate with a first voltage and the second transistor is configured to operate with a second voltage, wherein the second voltage is lower than the first voltage.

3. The memory device of claim 1, the first transistor comprises a first threshold voltage and the second transistor comprises a second threshold voltage with a magnitude lower than a magnitude of the first threshold voltage.

4. The memory device of claim 1, wherein the first semiconductor layer comprises a thickness less than 100 nm.

5. The memory device of claim 1, wherein the second transistor is a fully-depleted transistor having at least a portion of an active device region fully depleted during operation.

6. The memory device of claim 5, wherein the second transistor comprises a source/drain region vertically extending through the first semiconductor layer.

7. The memory device of claim 1, wherein the second semiconductor structure further comprises:
- a film stack of alternating conductive and dielectric layers; and
- memory strings vertically penetrating through the film stack.

8. The memory device of claim 7, wherein the second semiconductor structure further comprises:
- a third insulating layer covering the film stack; and
- third interconnect structures in the third insulating layer, wherein the third interconnect structures are electrically connected with a word line, a bit line or at least one of the second interconnect structures.

9. The memory device of claim 8, further comprising:
- a second semiconductor layer;
- a through-substrate-interconnect penetrating through the second semiconductor layer; and
- a contact pad electrically connected with the through-substrate-interconnect, wherein the contact pad and the film stack are on opposite sides of the second semiconductor layer.

10. The memory device of claim 9, further comprising:
- a contact vertical-interconnect-access (VIA) penetrating through the third insulating layer, wherein the contact VIA is connected with the through-substrate-interconnect and at least one of the second interconnect structures.

11. A memory system, comprising:
- a memory device, comprising:
  - a first semiconductor structure, comprising:
    - a first transistor comprising a first gate dielectric layer;
    - a first semiconductor layer disposed on the first transistor;
    - an isolation structure vertically penetrating through the first semiconductor layer to electrically isolate a second transistor;
    - a first insulating layer disposed on the first transistor;
    - first interconnect structures disposed in the first insulating layer, wherein at least one of the first interconnect structures is electrically connected with the first transistor;
    - the second transistor, disposed on and in the first semiconductor layer, wherein the second transistor comprises a second gate dielectric layer having a thickness less than a thickness of the first gate dielectric layer;

a second insulating layer disposed on the second transistor;

second interconnect structures disposed in the second insulating layer, wherein at least one of the second interconnect structures is electrically connected with the second transistor, wherein at least one of the second interconnect structures is connected with at least one of the first interconnect structures by extending through the isolation structure; and a second semiconductor structure disposed on the first semiconductor structure, wherein the second semiconductor structure comprises memory cells coupled to the first transistor and the second transistor; and a memory controller configured to send commands to the memory device for programming the memory device.

12. The memory system of claim 11, wherein the first transistor is configured to operate with a first voltage and the second transistor is configured to operate with a second voltage, wherein the second voltage is lower than the first voltage.

13. The memory system of claim 11, the first transistor comprises a first threshold voltage and the second transistor comprises a second threshold voltage with a magnitude lower than a magnitude of the first threshold voltage.

14. The memory system of claim 11, wherein the first semiconductor layer comprises a thickness less than 100 nm.

15. The memory system of claim 11, wherein the second transistor is a fully-depleted transistor having at least a portion of an active device region fully depleted during operation.

16. The memory system of claim 15, wherein the second transistor comprises a source/drain region vertically extending through the first semiconductor layer.

17. The memory system of claim 11, wherein the second semiconductor structure further comprises:

a film stack of alternating conductive and dielectric layers; and memory strings vertically penetrating through the film stack.

18. The memory system of claim 17, wherein the second semiconductor structure further comprises:

a third insulating layer covering the film stack; and third interconnect structures in the third insulating layer, wherein the third interconnect structures are electrically connected with a word line, a bit line or at least one of the second interconnect structures.

19. The memory system of claim 18, further comprising:

a second semiconductor layer;

a through-substrate-interconnect penetrating through the second semiconductor layer; and a contact pad electrically connected with the through-substrate-interconnect, wherein the contact pad and the film stack are on opposite sides of the second semiconductor layer.

20. The memory system of claim 19, further comprising:

a contact vertical-interconnect-access (VIA) penetrating through the third insulating layer, wherein the contact VIA is connected with the through-substrate-interconnect and at least one of the second interconnect structures.

* * * * *